(12) United States Patent
Corona et al.

(10) Patent No.: US 9,142,666 B2
(45) Date of Patent: Sep. 22, 2015

(54) INTEGRATED ELECTRONIC DEVICE AND METHOD FOR MANUFACTURING THEREOF

(75) Inventors: Donato Corona, Augusta (IT); Nicolo' Frazzetto, S. Giovanni la Punta (IT); Antonio Giuseppe Grimaldi, S. Giovanni la Punta (IT); Corrado Iacono, Syracuse (IT); Monica Micciche', Enna (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 127 days.

(21) Appl. No.: 13/221,733

(22) Filed: Aug. 30, 2011

(65) Prior Publication Data

US 2012/0049902 A1    Mar. 1, 2012

(30) Foreign Application Priority Data

Aug. 30, 2010 (IT) ............... TO2010A0722

(51) Int. Cl.
*H01L 29/205* (2006.01)
*H01L 29/78* (2006.01)
(Continued)

(52) U.S. Cl.
CPC .......... *H01L 29/7813* (2013.01); *H01L 21/046* (2013.01); *H01L 29/1004* (2013.01); *H01L 29/1095* (2013.01); *H01L 29/165* (2013.01); *H01L 29/66068* (2013.01); *H01L 29/7322* (2013.01); *H01L 29/7802* (2013.01); *H01L 29/8083* (2013.01); *H01L 21/02381* (2013.01); *H01L 21/02447* (2013.01); *H01L 21/02502* (2013.01); *H01L 21/02529* (2013.01);
(Continued)

(58) Field of Classification Search
USPC .................... 257/77, 136, 328, 135, 331, 341
See application file for complete search history.

(56) References Cited

U.S. PATENT DOCUMENTS

| 4,074,293 A | 2/1978 | Kravitz |
| 5,272,096 A | 12/1993 | de Fresart et al. |

(Continued)

FOREIGN PATENT DOCUMENTS

| EP | 0726604 | 8/1996 |
| EP | 1263052 | 12/2002 |

(Continued)

OTHER PUBLICATIONS

Search Report for Italian Application No. TO20100723, Ministero dello Sviluppo Economico, Munich, Feb. 8, 2011, pp. 2.

(Continued)

*Primary Examiner* — Jaehwan Oh
(74) *Attorney, Agent, or Firm* — Allen, Dyer, Doppelt, Milbrath & Gilchrist, P.A.

(57) ABSTRACT

An embodiment of an integrated electronic device formed in a body of semiconductor material, which includes: a substrate of a first semiconductor material, the first semiconductor material having a first bandgap; a first epitaxial region of a second semiconductor material and having a first type of conductivity, which overlies the substrate and defines a first surface, the second semiconductor material having a second bandgap wider than the first bandgap; and a second epitaxial region of the first semiconductor material, which overlies, and is in direct contact with, the first epitaxial region. The first epitaxial region includes a first buffer layer, which overlies the substrate, and a drift layer, which overlies the first buffer layer and defines the first surface, the first buffer layer and the drift layer having different doping levels.

39 Claims, 13 Drawing Sheets

(51) Int. Cl.
*H01L 21/04* (2006.01)
*H01L 29/10* (2006.01)
*H01L 29/66* (2006.01)
*H01L 29/732* (2006.01)
*H01L 29/808* (2006.01)
*H01L 29/165* (2006.01)
*H01L 21/02* (2006.01)
*H01L 29/06* (2006.01)
*H01L 29/08* (2006.01)
*H01L 29/16* (2006.01)
*H01L 29/40* (2006.01)

(52) U.S. Cl.
CPC ....... *H01L21/02576* (2013.01); *H01L 29/0615* (2013.01); *H01L 29/0634* (2013.01); *H01L 29/0638* (2013.01); *H01L 29/0821* (2013.01); *H01L 29/0878* (2013.01); *H01L 29/0886* (2013.01); *H01L 29/1608* (2013.01); *H01L 29/402* (2013.01)

(56) References Cited

U.S. PATENT DOCUMENTS

| | | | |
|---|---|---|---|
| 5,459,089 A | 10/1995 | Baliga | |
| 5,661,312 A | 8/1997 | Weitzel et al. | |
| 5,877,515 A * | 3/1999 | Ajit | 257/76 |
| 5,903,020 A * | 5/1999 | Siergiej et al. | 257/264 |
| 6,002,143 A | 12/1999 | Terasawa | |
| 6,239,463 B1 * | 5/2001 | Williams et al. | 257/328 |
| 6,331,727 B1 | 12/2001 | Nakajima et al. | |
| 6,458,013 B1 | 10/2002 | Saka et al. | |
| 6,593,620 B1 | 7/2003 | Hshieh et al. | |
| 6,605,504 B1 | 8/2003 | JaiPrakash et al. | |
| 7,078,781 B2 | 7/2006 | Hatakeyama et al. | |
| 7,294,860 B2 | 11/2007 | Mazzola et al. | |
| 7,416,929 B2 | 8/2008 | Mazzola et al. | |
| 7,485,895 B2 | 2/2009 | Kaneko | |
| 7,489,011 B2 * | 2/2009 | Yilmaz | 257/409 |
| 7,646,061 B2 * | 1/2010 | Hirler | 257/341 |
| 7,671,383 B2 | 3/2010 | Hayashi et al. | |
| 7,691,711 B2 * | 4/2010 | Stum et al. | 438/268 |
| 7,719,055 B1 | 5/2010 | McNutt et al. | |
| 7,781,786 B2 | 8/2010 | Hayashi et al. | |
| 7,795,691 B2 | 9/2010 | Zhang et al. | |
| 7,851,274 B1 * | 12/2010 | Shah | 438/139 |
| 7,902,025 B2 | 3/2011 | Hayashi et al. | |
| 7,923,320 B2 | 4/2011 | Ryu | |
| 7,977,210 B2 * | 7/2011 | Ota et al. | 438/459 |
| 7,994,513 B2 | 8/2011 | Yamamoto et al. | |
| 7,999,343 B2 | 8/2011 | Tihanyi | |
| 8,188,538 B2 | 5/2012 | Nakano et al. | |
| 8,278,682 B2 | 10/2012 | Yoshikawa et al. | |
| 8,350,317 B2 * | 1/2013 | Kocon | 257/328 |
| 8,829,533 B2 * | 9/2014 | Domeij | 257/77 |
| 2003/0222327 A1 | 12/2003 | Yamaguchi et al. | |
| 2004/0212011 A1 | 10/2004 | Ryu | |
| 2004/0222458 A1 | 11/2004 | Hsieh et al. | |
| 2005/0269573 A1 * | 12/2005 | Seng et al. | 257/77 |
| 2006/0006394 A1 * | 1/2006 | Kordina | 257/77 |
| 2006/0043379 A1 * | 3/2006 | Zhang et al. | 257/77 |
| 2006/0113593 A1 * | 6/2006 | Sankin et al. | 257/341 |
| 2007/0050530 A1 * | 3/2007 | Rajan | 711/5 |
| 2007/0096172 A1 | 5/2007 | Tihanyi et al. | |
| 2007/0158658 A1 * | 7/2007 | Ryu | 257/77 |
| 2007/0235745 A1 | 10/2007 | Hayashi et al. | |
| 2008/0150020 A1 * | 6/2008 | Challa et al. | 257/331 |
| 2009/0008709 A1 * | 1/2009 | Yedinak et al. | 257/331 |
| 2009/0085064 A1 | 4/2009 | Rueb et al. | |
| 2009/0278169 A1 | 11/2009 | Hayashi et al. | |
| 2009/0280610 A1 | 11/2009 | Umezaki | |
| 2009/0315039 A1 * | 12/2009 | Tsuji | 257/77 |
| 2010/0001362 A1 | 1/2010 | Van Dalen et al. | |
| 2010/0117097 A1 * | 5/2010 | Domeij | 257/77 |
| 2012/0037980 A1 | 2/2012 | Peake et al. | |
| 2012/0049940 A1 | 3/2012 | Frisina et al. | |
| 2012/0056200 A1 | 3/2012 | Frisina et al. | |

FOREIGN PATENT DOCUMENTS

| | | |
|---|---|---|
| EP | 1503425 | 2/2005 |
| EP | 1587147 | 10/2005 |
| JP | 6151867 | 5/1994 |

OTHER PUBLICATIONS

Search Report for Italian Application No. TO20100722, Ministero dello Sviluppo Economico, Munich, Feb. 11, 2011, pp. 2.

Search Report for Italian Application No. TO20100724, Ministero dello Sviluppo Economico, Munich, Feb. 14, 2011, pp. 2.

Mietek Bakowski, Adolf Schener, Per Ericsson, Helena Sternberg, Hiroyuki Nagasawa, and Masayuki Abe, "Development of 3C-SiC MOSFETs", Journal of Telecommunications and Information Technology, Feb. 2007, pp. 49-56.

M. Grieb, M. Noborio, D. Peters, A. J. Bauer, P. Friedrichs, T. Kimoto and H. Ryssel, "Electrical Characterization of MOS Structures with Deposited Oxides Annealed in N20 or NO", Malerials Science Forum vols. 615-617 (2009) pp. 521-524, 2009 Trans Tech Publications, Switzerland.

\* cited by examiner

INTEGRATED ELECTRONIC DEVICE AND METHOD FOR MANUFACTURING THEREOF

PRIORITY CLAIM

The instant application claims priority to Italian Patent Application No. TO2010A000722, filed Aug. 30, 2010, which application is incorporated herein by reference in its entirety.

RELATED APPLICATION DATA

This application is related to the U.S. patent application Ser. No. 13/221,694 entitled VERTICAL-CONDUCTION INTEGRATED ELECTRONIC DEVICE AND METHOD FOR MANUFACTURING THEREOF, filed Aug. 30, 2011, and application Ser. No. 13/221,778 entitled INTEGRATED ELECTRONIC DEVICE WITH EDGE-TERMINATION STRUCTURE AND MANUFACTURING METHOD THEREOF, filed Aug. 30, 2011 and which are incorporated herein by reference in their entireties.

TECHNICAL FIELD

An embodiment relates to an integrated electronic device and to the method for manufacturing thereof.

BACKGROUND

As is known, there are today available numerous electronic devices made at least in part of silicon carbide (SiC).

For example, there are today available metal-oxide semiconductor field-effect transistors (MOSFETs) made at least in part of silicon carbide, which is characterized by a bandgap that is wider than the bandgap of silicon. Consequently, given the same doping level, the critical electrical field of silicon carbide is higher than the critical electrical field of silicon. For example, in the case where silicon carbide has a so-called 3C polytype, the critical electrical field is approximately equal to four times the critical electrical field of silicon; in the cases where silicon carbide has instead a 6H or a 4H polytype, the critical electrical field is, respectively, approximately eight times and ten times the critical electrical field of silicon.

Thanks to its high critical electrical field, silicon carbide enables provision of junctions having breakdown voltages higher than what may be obtained using silicon. Furthermore, exploiting the high critical electrical field, it may be possible to provide transistors with drift regions having thicknesses smaller than the drift regions of traditional silicon transistors; said transistors are hence characterized by low on-resistances ($R_{on}$).

On the other hand, silicon carbide has a low diffusiveness of the dopant species, even at high temperatures. In addition, as compared to silicon, silicon carbide is characterized by a reduced mobility $\mu$ of the carriers. In fact, in silicon carbide, the mobility $\mu$ of the carriers is typically of the order of some hundreds of $cm^2/Vs$, whereas, in silicon, the mobility $\mu$ of the carriers can exceed even thousands of $cm^2/Vs$. In particular, in the case of MOSFETs made of 4H-polytype silicon carbide, the mobility $\mu$ of the carriers in the respective channel regions is limited to approximately 50 $cm^2/Vs$, on account of the generation of states at the oxide-semiconductor interfaces.

In greater detail, there are today available electronic devices formed starting from a silicon-carbide substrate. However, the technology today available does not enable provision of silicon-carbide wafers with diameters larger than four inches; consequently, the manufacture of said electronic devices is generally more costly and technologically complex than the manufacture of electronic devices starting from silicon substrates.

In order to combine the advantages of silicon and silicon carbide, electronic devices have moreover been proposed formed starting from a silicon substrate and comprising one or more silicon-carbide epitaxial layers. For example, U.S. Pat. No. 5,877,515, which is incorporated by reference, describes a semiconductor device, and in particular a MOSFET, having a silicon layer, which is deposited on a silicon-carbide layer, which in turn is deposited on a silicon substrate.

Operatively, the silicon-carbide layer enables a concentration of charge to be obtained that is higher than what may be obtained in the case of a silicon layer, given the same breakdown voltage. However, it may be possible that in certain conditions, and in particular in the case where the semiconductor device is biased so as to work in the region of inhibition, a non-negligible electrical field is generated within the silicon substrate. In said conditions, it is the silicon itself that limits, with its own critical electrical field, the breakdown voltage of the semiconductor device.

In order to prevent generation of a non-negligible electrical field within the silicon substrate, it may possible to increase the thickness of the silicon-carbide layer; however, said operation, in addition to being technologically complex, entails an increase of the on-resistance of the semiconductor device.

SUMMARY

An embodiment is an integrated electronic device and a manufacturing method that enable drawbacks of the known art to be overcome at least in part.

BRIEF DESCRIPTION OF THE DRAWINGS

For a better understanding of disclose concepts, embodiments are now described, purely by way of non-limiting example and with reference to the annexed drawings, wherein.

DETAILED DESCRIPTION

Figure 1:
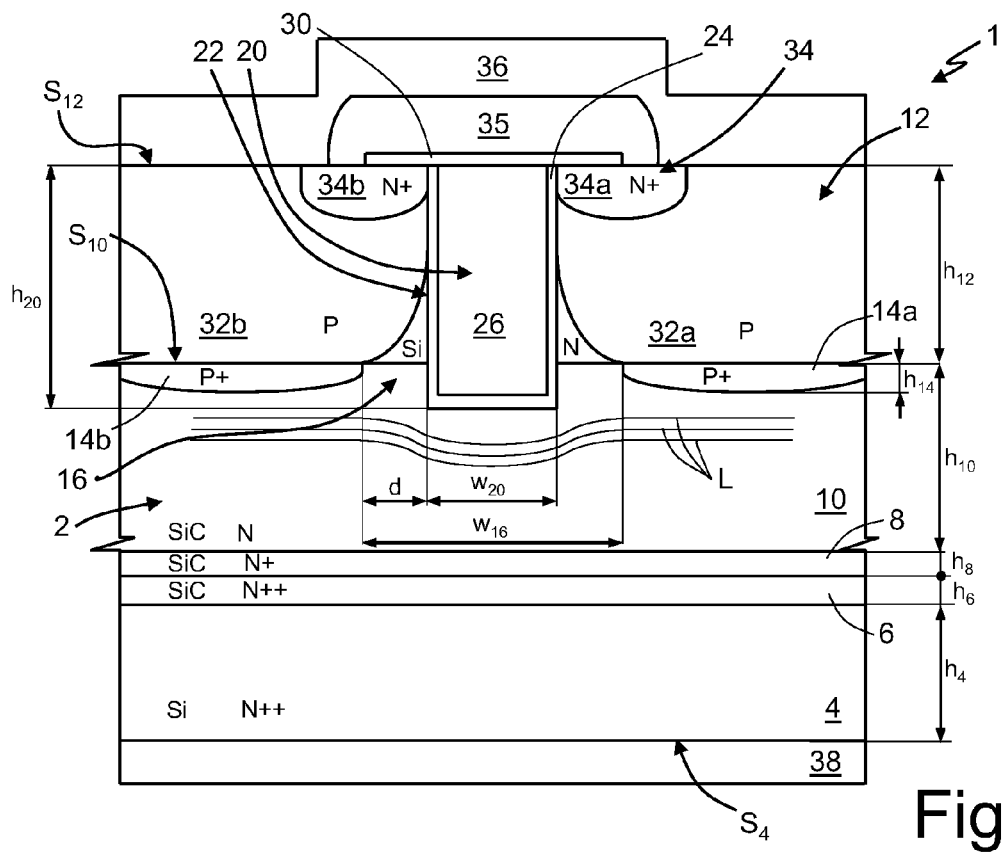
FIGS. 1 and 3 show cross sections of embodiments of trench MOSFETs.

FIG. 1 shows an embodiment of the present integrated electronic device, which forms in the case in point a trench MOSFET 1.

In detail, the trench MOSFET 1 is formed by a body 2 of semiconductor material, which is made up of a silicon substrate 4, of an N++ type (for example, doped with arsenic) and has a bottom surface $S_4$; the silicon may have a crystallographic structure of the so-called <100> type. Furthermore, the body 2 includes a first buffer layer 6, a second buffer layer 8, and a drift layer 10.

In detail, the substrate 4 has a thickness $h_4$ of approximately between 500 μm and 1500 μm, and moreover has a doping level higher than approximately $1·10^{19}$ cm$^{-3}$, in such a way that the resistivity ρ is lower than approximately 6 mΩ·cm.

The first buffer layer 6 is set on top of the substrate 4, with which it is in direct contact, is made of silicon carbide and is of an N++ type (for example, doped with nitrogen or phosphorus). In particular, the first buffer layer 6 is made of silicon carbide of the 3C polytype, which, when grown on silicon of the <100> type, has a crystalline lattice with a low concentration of imperfections. In addition, the first buffer layer 6 has a thickness $h_6$ lower than approximately 0.5 μm, and moreover has a doping level of approximately between $5·10^{16}$ cm$^{-3}$ and $1·10^{17}$ cm$^{-3}$.

The second buffer layer 8 is arranged on top of the first buffer layer 6, with which it is in direct contact, is made of silicon carbide and is of an N+ type (for example, doped with nitrogen or phosphorus). In particular, also the second buffer layer 8 is made of silicon carbide of the 3C polytype. In addition, the second buffer layer 8 has a thickness $h_8$ lower than approximately 0.5 μm, and moreover has a doping level of approximately between $1·10^{16}$ cm$^{-3}$ and $5·10^{16}$ cm$^{-3}$.

The drift layer 10 is arranged on top of the second buffer layer 8, with which it is in direct contact, is made of silicon carbide, and is of an N type (for example, doped with nitrogen or phosphorus). In particular, also the drift layer 10 is made of silicon carbide of the 3C polytype. In addition, the drift layer 10 has a thickness $h_{10}$ of approximately between 1 μm and 10 μm, and moreover has a doping level of approximately between $1·10^{15}$ cm$^{-3}$ and $1·10^{16}$ cm$^{-3}$. Furthermore, the drift layer 10 defines an intermediate surface $S_{10}$.

The body 2 of the trench MOSFET 1 further includes a top layer 12, which is made of silicon and is of an N type (for example, doped with phosphorus).

In detail, the top layer 12 defines a top surface $S_{12}$ and extends over the intermediate surface $S_{10}$, in direct contact with the drift layer 10. Furthermore, the top layer 12 has a thickness $h_{12}$ in the range approximately between 1 μm and 3 μm; again, the top layer 12 has a doping level of approximately between $1·10^{15}$ cm$^{-3}$ and $1·10^{16}$ cm$^{-3}$.

In practice, the body 2 of semiconductor material is delimited by the top surface $S_{12}$ and by the bottom surface $S_4$. Furthermore, extending underneath the intermediate surface $S_{10}$ are a first semiconductor region 14a and a second semiconductor region 14b, both of a P+ type.

In detail, the first and second semiconductor regions 14a, 14b are arranged at a distance apart laterally so as to define an internal region 16, arranged between the first and second semiconductor regions 14a, 14b. Furthermore, the first and second semiconductor regions 14a, 14b extend from the intermediate surface $S_{10}$, with a depth $h_{14}$ smaller than the thickness $h_{10}$, for example, smaller than approximately 1 μm. Once again, the first and second semiconductor regions 14a, 14b have a doping peak level of approximately between $1·10^{17}$ cm$^{-3}$ and $1·10^{19}$ cm$^{-3}$.

Operatively, the first and second semiconductor regions 14a, 14b function, respectively, as first and second deep body regions 14a, 14b.

The trench MOSFET 1 further includes a trench 20, which extends from the top surface $S_{12}$ and has a thickness $h_{20}$. As illustrated by way of example in FIG. 1, the thickness $h_{20}$ may be such that $h_{20} \geq h_{12}$. In other words, the trench 20 may extend through the top layer 12 until it partially penetrates within the drift layer 10; for example, it may be possible that $h_{20}=h_{12}+\Delta$, with Δ approximately between 0.5 μm and 1 μm. Furthermore, the trench 20 is arranged at a distance apart laterally with respect to the first and second deep body regions 14a, 14b, so as to extend within the internal region 16 without contacting the first and second deep body regions 14a, 14b, which are approximately equidistant from the trench 20 itself.

In detail, the trench 20 is delimited by a wall 22, and the first and second deep body regions 14a, 14b are both at a distance of approximately d from the wall 22. In practice, if we designate by $w_{20}$ the width of the trench 20 and by $w_{16}$ the width of the internal region 16, we have $w_{16} \approx w_{20}+2d$.

In greater detail, the wall 22 is coated internally with a first oxide layer 24. Furthermore, present within the trench 20 is a first gate region 26, which is in direct contact with the first oxide layer 24 and is made of polysilicon.

The trench MOSFET 1 further includes a first oxide region 30, which is deposited on the top surface $S_{12}$, is vertically aligned with the trench 20, and is in direct contact with the first oxide layer 24 and with the first gate region 26. The first oxide region may have a thickness, for example, approximately between 20 nm and 80 nm.

The trench MOSFET 1 further includes a first top body region 32a and a second top body region 32b, both of a P type (for example, doped with boron) and with a peak doping level of approximately between $1·10^{16}$ cm$^{-3}$ and $1·10^{18}$ cm$^{-3}$. In detail, the first and second top body regions 32a, 32b are arranged laterally at a distance apart and extend through the top layer 12 starting from the top surface $S_{12}$, until they contact, respectively, the first and second deep body regions 14a, 14b. Furthermore, the first and second top body regions 32a, 32b extend laterally until they contact the wall 22 of the trench 20, which separates the first and second top body regions 32a, 32b.

The trench MOSFET 1 further includes a first source region 34 formed by a first source subregion 34a and a second source subregion 34b, both of an N+ type (for example, doped with phosphorus) and with a peak doping level of approximately $1·10^{20}$ cm$^{-3}$. In detail, the first and second source subregions 34a, 34b extend, starting from the top surface $S_{12}$, within the top layer 12. In greater detail, the first and second source subregions 34a, 34b are arranged laterally at a distance apart, in such a way that the trench 20 extends between the first and second source subregions 34a, 34b, with which it is in direct contact. In particular, the first and second source subregions 34a, 34b are in direct contact with the first oxide layer 24; moreover, the first and second source subregions 34a, 34b are in direct contact with the first oxide region 30.

In practice, the first source region 34 and the trench 20 are housed within a operative region O, a bottom portion of which is formed by the internal region 16 and is hence delimited by the first and second deep body regions 14a, 14b.

The trench MOSFET 1 further includes a first dielectric region 35, which overlies, in direct contact, the first oxide region 30, and is in direct contact with the first and second source subregions 34a, 34b.

The trench MOSFET 1 further includes a first top metallization 36 and a bottom metallization 38, as well as a first gate metallization, the latter (not shown) contacting, in a way in itself known, the first gate region 26.

In detail, the first top metallization 36 extends over the top surface $S_{12}$, surrounding at the top and laterally the first dielectric region 35, and contacting the first and second source subregions 34a, 34b, as well as the first and second top body regions 32a, 32b.

The bottom metallization 38 extends, instead, underneath the bottom surface $S_4$ of the substrate 4, with which it is in direct contact. In practice, the substrate 4, the first and second buffer layers 6, 8, and the drift layer 10 function as a drain region.

Operatively, the first top metallization 36 functions as a source metallization, whilst the bottom metallization 38 functions as a drain metallization. Furthermore, the first gate region 26, the first oxide layer 24, and the top layer 12 (and in particular, the first and second top body regions 32a, 32b) form a junction of the metal-oxide-semiconductor type. Hence, by biasing in a way in itself known the first top metallization 36 and the first gate metallization, it is possible to form a channel of an N type within the top layer 12, in particular within a region of the top layer 12 arranged in direct contact with the first oxide layer 24. Furthermore, by biasing in a way in itself known the first top metallization 36 and the bottom metallization 38 with a voltage $V_{DS}$, it is possible to generate a current $I_{DS}$.

The current $I_{DS}$ flows between the first top metallization 36 and the bottom metallization 38; hence, it has a vertical direction and flows both through the silicon and through the silicon carbide. In particular, the current $I_{DS}$ flows within the channel of an N type, traversing the top layer 12, as well as the drift layer 10 and the first and second buffer layers 6, 8.

In the case where the voltage $V_{DS}$ is such as to reversely bias the PN junctions present between the drift layer 10 and the first and second deep body regions 14a, 14b, the magnitude of the voltage $V_{DS}$ cannot exceed a maximum voltage $V_{max}$; otherwise, a breakdown phenomenon within the trench MOSFET 1 would be triggered.

In particular, the maximum voltage $V_{max}$ is particularly high thanks to the presence of the first and second buffer layers 6, 8, and to the respective doping levels, which prevent the generation of significant electrical fields within the silicon substrate 4.

Likewise, the first and second deep body regions 14a, 14b prevent generation of significant electrical fields within the top silicon layer 12. In other words, the voltage $V_{DS}$ drops substantially within the first and second deep body regions 14a, 14b, as well as within the drift layer 10 and the first and second buffer layers 6, 8. Instead, within the top layer 12 and the substrate 4, there is little to no voltage drop, because the electrical field is, to a first approximation, negligible. Consequently, the maximum voltage $V_{max}$ is limited at the top, instead of by the critical electrical field of silicon, by the critical electrical field of silicon carbide, which, as has been said, is higher than the critical electrical field of silicon.

Furthermore, with regard to the top layer 12, the electrical field present therein is negligible not only in the proximity of the first and second deep body regions 14a, 14b, but also in the proximity of the internal region 16, i.e., where the top layer 12 is not in direct contact with the first and second deep body regions 14a, 14b. In fact, as illustrated qualitatively in FIG. 1, underneath the first and second deep body regions 14a, 14b, the equipotential lines L that are generated in use within the trench MOSFET 1 are approximately parallel to the first and second deep body regions 14a, 14b. Instead, in an area corresponding to the internal region 16, the equipotential lines L bend on account of the presence of the trench 20, and in particular of the first oxide layer 24.

Figure 2:
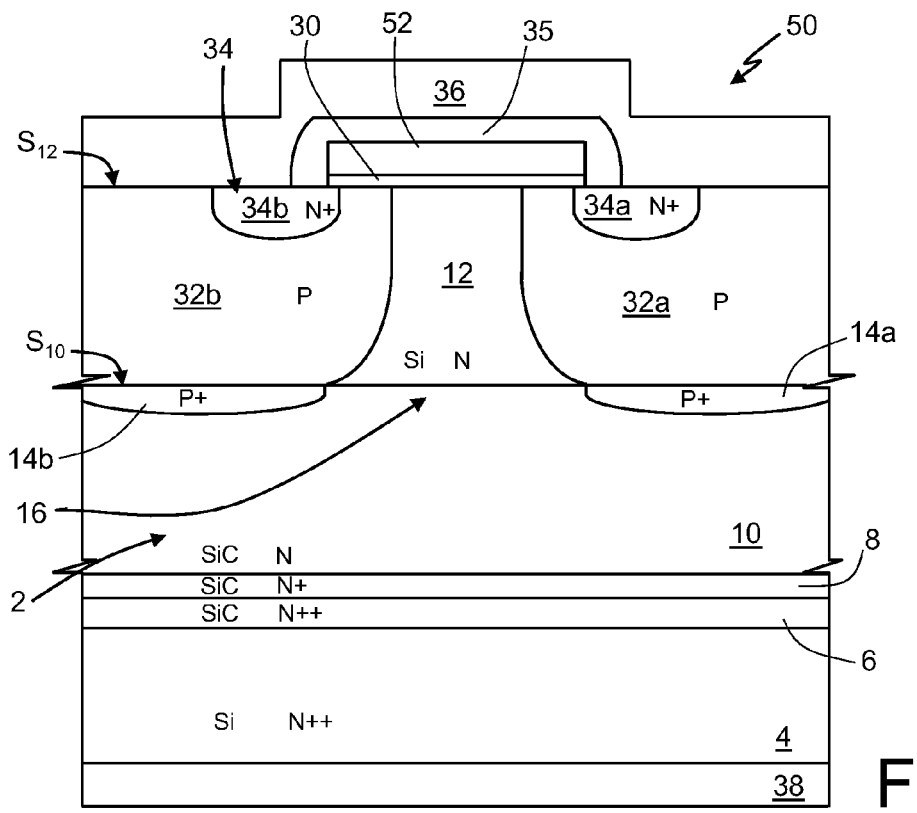
FIGS. 2 and 4 show cross sections of embodiments of planar-cell MOSFETs.

FIG. 2 illustrates a different embodiment of the present integrated electronic device, which in the case in point forms a planar-cell MOSFET 50, described in what follows. Elements already present in the trench MOSFET 1 illustrated in FIG. 1 are designated by the same reference numbers; moreover, the ensuing description is limited to the differences of the planar-cell MOSFET 50 with respect to the trench MOSFET 1 illustrated in FIG. 1.

In detail, the planar-cell MOSFET 50 is without the trench 20, and consequently also without the first oxide layer 24 and the first gate region 26. Furthermore, arranged between the first oxide region 30 and the first dielectric region 35 is a second gate region 52, made of polysilicon, which overlies the first oxide region 30, with which it is in direct contact. In particular, the second gate region 52 has a thickness equal, for example, to approximately 600 nm.

In addition, the first and second top body regions 32a, 32b surround laterally, respectively, the first and second source subregions 34a, 34b. Furthermore, in a way similar to what is illustrated in FIG. 1, also the planar-cell MOSFET 50 includes the first top metallization 36, the bottom metallization 38, and the first gate metallization, the latter (not shown) contacting in a way in itself known the second gate region 52.

Operatively, the second gate region 52, the first oxide region 30, and the top layer 12 form a junction of the metal-oxide-semiconductor type; consequently, by biasing in a way in itself known the first source region 34 and the second gate region 52, it may be possible to form, underneath the first oxide region 30, a channel of an N type. In particular, the channel of an N type extends within portions of the first and of the second top body regions 32a, 32b in contact with the first oxide region 30 and between the first and second source subregions 34a, 34b.

Furthermore, by biasing in a way in itself known the first top metallization 36 and the bottom metallization 38 with the voltage $V_{DS}$, it may be possible to generate the current $I_{DS}$, which flows vertically, traversing the internal region 16, in a way similar to what has been described previously.

Figure 3:
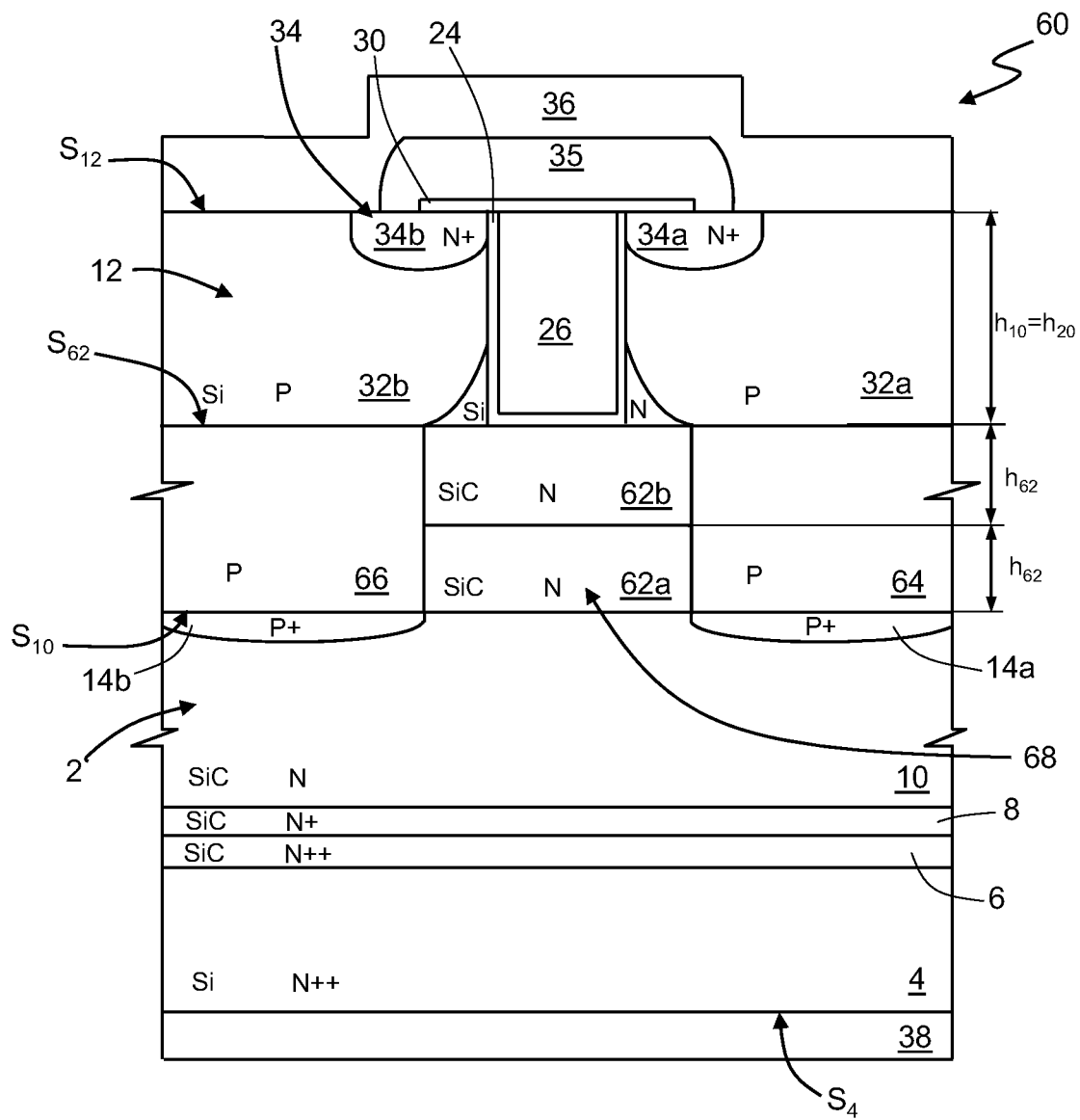

FIG. 3 illustrates a different embodiment of the present integrated electronic device, which in the case in point forms an enhanced trench MOSFET 60, described in what follows. Elements already present in the trench MOSFET 1 illustrated in FIG. 1 are designated by the same reference numbers; moreover, the ensuing description is limited to the differences of the enhanced trench MOSFET 60 with respect to the trench MOSFET 1 illustrated in FIG. 1.

In detail, the enhanced trench MOSFET 60 includes one or more intermediate layers of an N type (for example, doped with nitrogen or phosphorus), which are arranged between the drift layer 10 and the top layer 12, and are made of silicon carbide of the 3C polytype. Furthermore, the intermediate layers may have approximately one and the same thickness $h_{62}$ and one and the same doping level, for example equal to the doping level of the drift layer 10.

By way of example, the embodiment illustrated in FIG. 3 has a first intermediate layer and a second intermediate layer, designated by 62a and 62b, respectively. In particular, the first intermediate layer 62a overlies the drift layer 10, with which it is in direct contact. Instead, the second intermediate layer 62b overlies the first intermediate layer 62a, with which it is in direct contact, and is overlaid by the top layer 12, with which it is in direct contact. The second intermediate layer 62b defines moreover a contact surface $S_{62}$, which contacts the top layer 12. In addition, in said embodiment, the trench 20 may extend, for example, up to the contact surface $S_{62}$, i.e., with $h_{20}=h_{10}$ (or approximately equal to $h_{10}$).

The enhanced trench MOSFET 60 further includes a first intermediate body region 64 and a second intermediate body region 66, both of a P type (for example, doped with boron) and with peak doping levels of approximately between $1 \cdot 10^{16}$ cm$^{-3}$ and $1 \cdot 10^{18}$ cm$^{-3}$. In detail, the first and second intermediate body regions 64, 66 are arranged laterally at a distance apart and extend through the first and second intermediate layers 62a, 62b, starting from the contact surface $S_{62}$, until they contact, respectively, the first and second deep body regions 14a, 14b. Furthermore, the first and second intermediate body regions 64, 66 are, respectively, in contact with the first and second top body regions 32a, 32b.

Operatively, defining as a confinement region 68 the region formed by the portions of the first and second intermediate layers 62a, 62b not occupied either by the first intermediate body region 64 or by the second intermediate body region 66, it is possible to verify that, in use, the electrical field assumes, in this confinement region 68, a direction to a first approximation horizontal, i.e., parallel to the intermediate surface $S_{10}$. In this way, the possibility of formation within the top layer 12 of an appreciable electrical field is further reduced.

Figure 4:
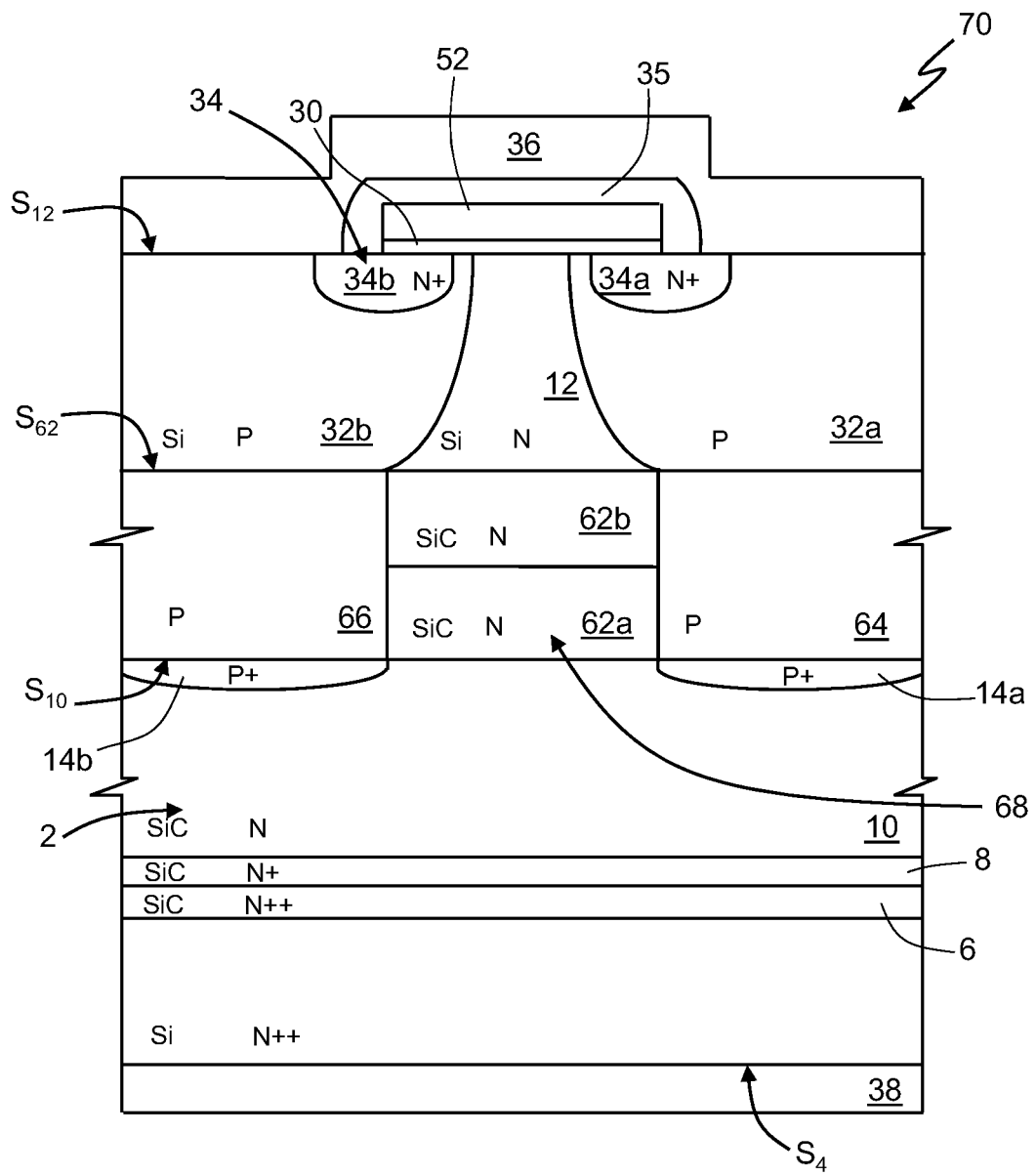

As illustrated in FIG. 4, a different embodiment of the present integrated electronic device is possible, which forms a modified planar-cell MOSFET 70, which in what follows will be referred to as "enhanced planar-cell MOSFET 70", described in what follows. Elements already present in the planar-cell MOSFET 50 illustrated in FIG. 2 are designated by the same reference numbers.

In detail, with respect to the planar-cell MOSFET 50, the enhanced planar-cell MOSFET 70 includes the already described one or more intermediate layers, as well as the first and second intermediate body regions 64, 66. In particular, the embodiment illustrated in FIG. 4 has the already mentioned first and second intermediate layers 62a, 62b, which enable the aforementioned reduction of the electrical field to be obtained within the top layer 12.

Figure 5:
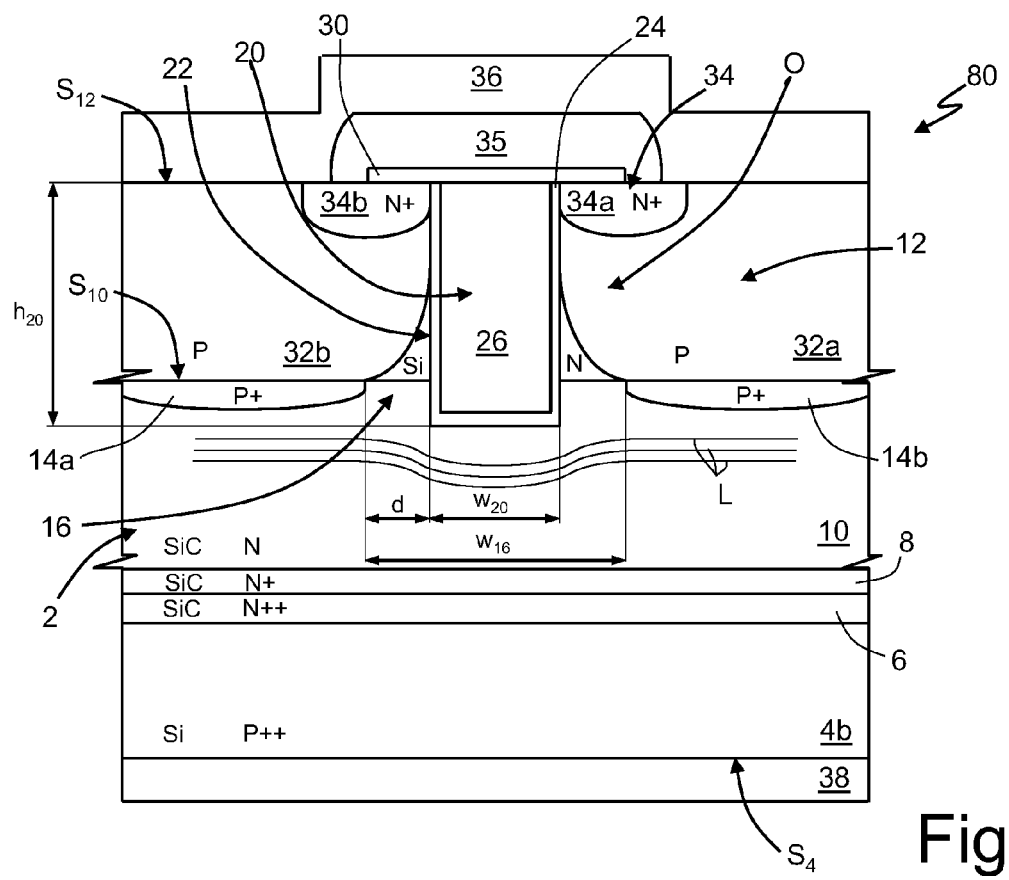
FIG. 5 shows a cross section of an embodiment of a trench IGBT.
Figure 6:
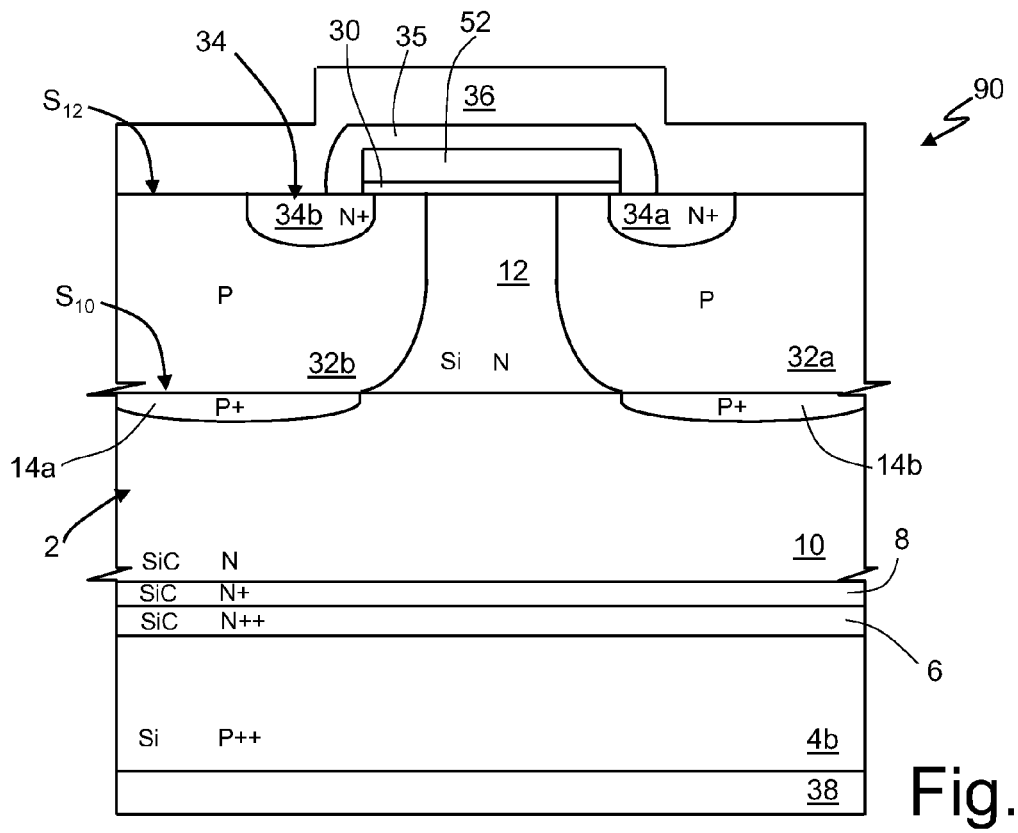
FIG. 6 shows a cross section of an embodiment of a planar-cell IGBT.

According to further embodiments of the present integrated electronic device, it may form, moreover, an insulated-gate bipolar junction transistor (IGBT), and in particular a trench IGBT 80 (FIG. 5), or else a planar-cell IGBT 90 (FIG. 6).

As illustrated in FIG. 5, where elements already illustrated in FIG. 1 are designated by the same reference numbers, the trench IGBT 80 differs from the trench MOSFET 1 in that it is formed starting from an alternative substrate 4b, instead of from the substrate 4 described previously.

In particular, the alternative substrate 4b is made of silicon with crystallographic structure of the <100> type, and is of a P++ type (for example, doped with boron); moreover, the alternative substrate 4b has a thickness $h_{4b}$ of approximately between 500 μm and 1500 μm, and has a doping level higher than approximately $1·10^{19}$ cm$^{-3}$, in such a way that the resistivity ρ is lower than approximately 6 mΩ·cm.

Operatively, the first and second deep body regions 14a, 14b function, together with the first and the second top body regions 32a, 32b, as a collector of an additional bipolar junction transistor of the PNP type, the base of which is formed by the first and second buffer layers 6, 8 and by the drift layer 10, and the emitter of which is formed by the alternative substrate 4b.

Likewise, as illustrated in FIG. 6, where elements already illustrated in FIG. 2 are designated by the same reference numbers, the planar-cell IGBT 90 differs from the planar-cell MOSFET 50 in that it is formed starting from the alternative substrate 4b, instead of from the substrate 4.

Figure 7:
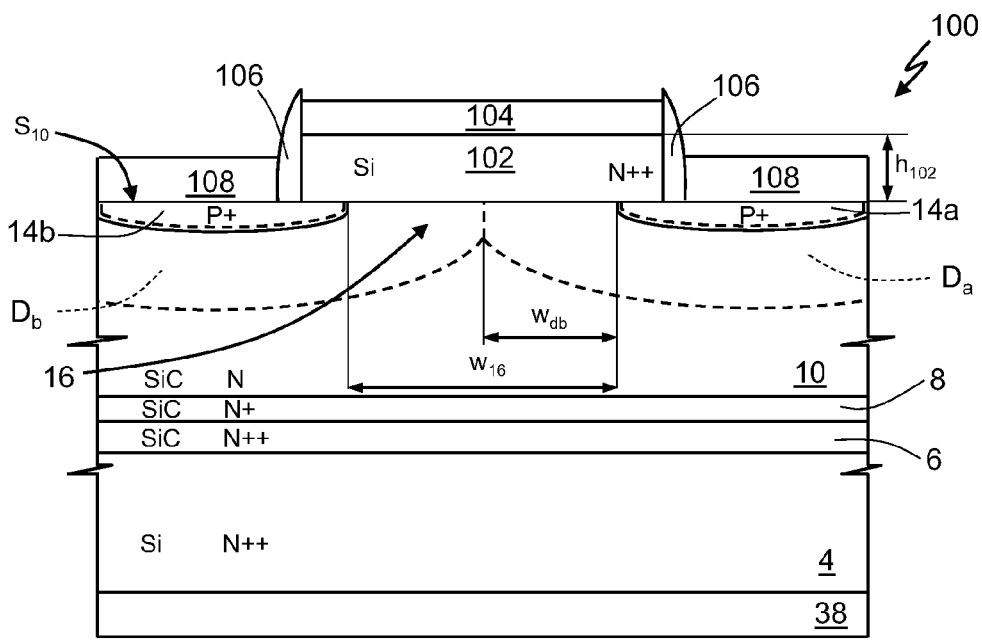
FIG. 7 shows a cross section of an embodiment of a JFET.

According to yet a further embodiment, the present integrated electronic device may moreover form a junction field-effect transistor 100 (JFET), illustrated in FIG. 7, where elements already illustrated in FIG. 1 are designated by the same reference numbers.

In detail, the JFET 100 includes the substrate 4, the first and second buffer layers 6, 8, and the drift layer 10, as well as the first and second semiconductor regions 14a, 14b, which function, respectively, as first and second gate subregions 14a, 14b. Instead, the JFET 100 is without the top layer 12.

The JFET 100 further includes a second source region 102, made of silicon and of an N++ type (for example doped with phosphorus). In particular, the second source region 102 extends over the intermediate surface $S_{10}$, in direct contact with the internal region 16, and has a doping level approximately equal to $1·10^{19}$ cm$^{-3}$ and a thickness $h_{102}$ lower than approximately 2 μm.

The JFET 100 further includes, instead of the first top metallization 36, a second top metallization 104, which overlies the second source region 102, with which it is in direct contact, and performs the function of source metallization. Furthermore, the JFET 100 includes a second dielectric region 106 (formed, for example, of borophosphosilicate glass, BPSG), which extends over the intermediate surface $S_{10}$ and surrounds laterally the second source region 102 and the second top metallization 104, with which it is in direct contact. Once again, in addition to the bottom metallization 38, the JFET 100 includes a second gate metallization 108, which extends over the intermediate surface $S_{10}$ and surrounds the second dielectric region 106, with which it is in direct contact. Furthermore, the second gate metallization 108 contacts the first and second gate subregions 14a, 14b.

In use, in the absence of voltage between the second top metallization 104 and the second gate metallization 108, at the interface between the drift layer 10 and the first gate subregion 14a a first depleted region $D_a$ is formed, and at the interface between the drift layer 10 and the second body subregion 14b a second depleted region $D_b$ is formed. These first and second depleted regions $D_a$, $D_b$ extend within the drift layer 10 with a depth of approximately $w_{db}$. Furthermore, in this embodiment, the width $w_{16}$ of the internal region 16, i.e., the lateral distance between the first and second gate subregions 14a, 14b, and the doping levels of the drift layer 10 and the first and the second gate subregions 14a, 14b are such that $w_{db} \approx w_{16}/2$. In other words, in the absence of voltage between the second top metallization 104 and the second gate metallization 108, the first and second depleted regions $D_a$, $D_b$ contact one another, insulating the second source region 102 from the substrate 4 and from the first and second buffer layers 6, 8, which function as drain regions. Consequently, the JFET 100 is a vertical-current-conduction device of the normally off type.

Figure 8:
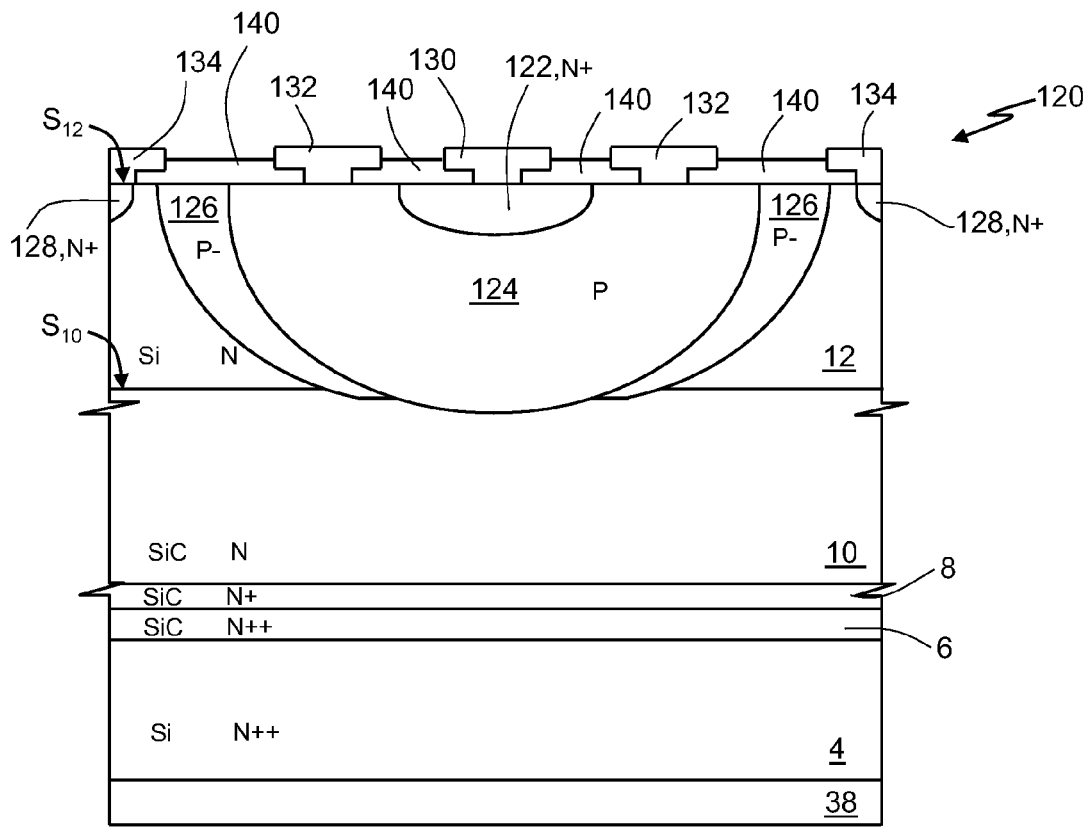
FIG. 8 shows a cross section of an embodiment of a bipolar junction transistor.

According to a further embodiment, the present integrated electronic device may form a bipolar junction transistor 120, illustrated in FIG. 8, where elements already illustrated in FIG. 1 are designated by the same reference numbers.

In detail, the bipolar junction transistor 120 includes the substrate 4, the first and second buffer layers 6, 8, the drift layer 10, and the top layer 12 described previously. Furthermore, the bipolar junction transistor 120 includes an emitter region 122, of an N+ type (for example, doped with phosphorus), which extends, starting from the top surface $S_{12}$, within the top layer 12, with a doping level approximately equal to $1·10^{20}$ cm$^{-3}$.

In addition, the bipolar junction transistor 120 includes, instead of the first and second semiconductor regions 14a, 14b, a base region 124 of a P type (for example, doped with boron), and moreover includes an edge region 126 of a P− type (for example, doped with boron).

In detail, the base region 124 has a peak doping level of approximately between $1·10^{16}$ cm$^{-3}$ and $1·10^{18}$ cm$^{-3}$; moreover, the base region 124 faces the top surface $S_{12}$ and extends within the top layer 12 so as to surround laterally and at the bottom the emitter region 122, to which it is vertically aligned. In particular, the base region 124 traverses the entire top layer 12 and extends partially within the drift layer 10, underneath the intermediate surface $S_{10}$.

The edge region 126 has a peak doping level of approximately between $1\cdot10^{14}$ cm$^{-3}$ and $1\cdot10^{16}$ cm$^{-3}$; moreover, the edge region 126 faces the top surface $S_{12}$ and extends within the top layer 12, externally with respect to the base region 124, with which it is in direct contact. In particular, the edge region 126 traverses the entire top layer 12 and extends partially within the drift layer 10, underneath the intermediate surface $S_{10}$, laterally surrounding the base region 124.

The bipolar junction transistor 120 further includes a channel-stopper region 128 of an N+ type (for example, doped with phosphorus) and with a doping level approximately equal to $1\cdot10^{20}$ cm$^{-3}$, which extends in the top layer 12, externally and at a distance from the edge region 126.

The bipolar junction transistor 120 further includes an emitter metallization 130, a base metallization 132, and an equipotential ring 134 (EQR), made of metal material, in addition to the bottom metallization 38, which functions as collector metallization and is coupled, in a way in itself known, to the equipotential ring 134.

In detail, the emitter metallization 130, the base metallization 132, and the equipotential ring 134 extend over the top surface $S_{12}$ and are in direct contact, respectively, with the emitter region 122, the base region 124, and the channel-stopper region 128.

The bipolar junction transistor 120 finally includes an insulating region 140, made of dielectric material, deposited on the top surface $S_{12}$, with which it is in direct contact, but for the contacts between the emitter metallization 130, the base metallization 132, the equipotential ring 134, and, respectively, the emitter region 122, the base region 124 and the channel-stopper region 128.

In use, the drift layer 10, part of the top layer 12, and the first and second buffer layers 6, 8 function as collector region of the bipolar junction transistor 120. Furthermore, the edge region 126 prevents concentration of the equipotential lines, and hence generation of a high electrical field, in the proximity of the PN junctions, which would be formed, in the absence of said edge region 126, between the base region 124 and the top layer 12 and the drift layer 10. In this way, a reduction of the maximum voltage $V_{max}$ at which the bipolar junction transistor 120 can operate without incurring in the breakdown phenomenon is avoided. As explained previously, also in the case of the bipolar junction transistor 120, said maximum voltage $V_{max}$ depends to a first approximation upon the critical electrical field of silicon carbide, thanks to the fact that the base region 124 extends also underneath the intermediate surface $S_{10}$.

As regards, instead, the channel-stopper region 128, it performs, in a way in itself known, the function of preventing formation of channels between the base region 124 and the outermost portions of the bipolar junction transistor 120.

An embodiment of the present electronic device may be obtained using the manufacturing method described in what follows and represented in FIGS. 9-24. In particular, the ensuing description regards, without this implying any loss of generality, manufacture of the trench MOSFET 1, of the enhanced trench MOSFET 60, of the JFET 100, and of the bipolar junction transistor 120; however, an embodiment of the manufacturing technique may be used to manufacture the devices 50, 70, 80, and 90 as well.

Figure 9:
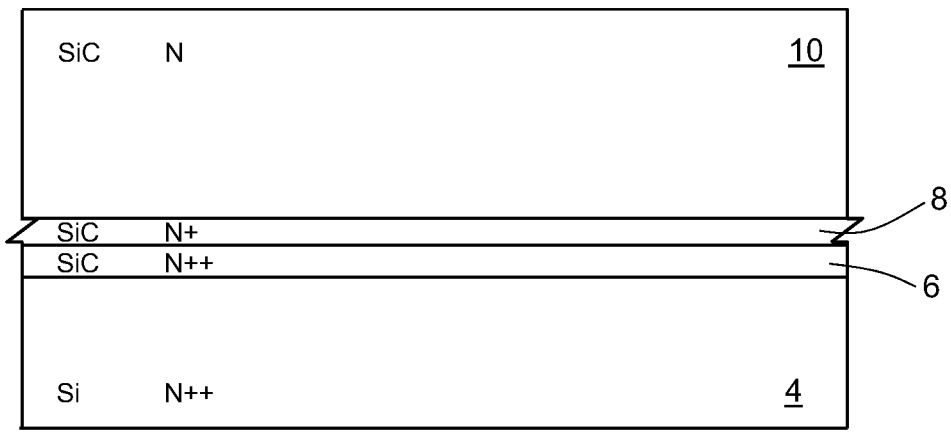
FIGS. 9-24 show cross sections of an embodiment of an integrated electronic device during successive manufacturing steps.

As illustrated in FIG. 9, to obtain the trench MOSFET 1 the substrate 4 is provided, and subsequently the first buffer layer 6, the second buffer layer 8, and the drift layer 10 are formed by epitaxial growth.

Next (FIG. 10), using a first resist mask 200, a first implantation of dopant species of a P type (for example, aluminium or boron atoms) is performed, represented by the arrows 202, so as to localize the dopant species in a first thin layer 14a' and a second thin layer 14b', both of a P+ type, which are arranged underneath the intermediate surface $S_{10}$ and are to form, respectively, the first and second deep body regions 14a, 14b, once appropriate annealing processes are terminated, as explained hereinafter. In particular, the first implant is executed with a hot process, i.e., at a temperature of approximately between 500° C. and 850° C., in order to limit the defects introduced during the implant itself within the silicon-carbide crystalline lattice; moreover, the first implant may be made with a dosage in a range approximately between $1\cdot10^{13}$ cm$^{-2}$ and $1\cdot10^{15}$ cm$^{-2}$ and an energy in the range approximately between 30 keV and 2 MeV. Furthermore, in a way in itself known, and hence not illustrated, the first implant may be made after providing, on the intermediate surface $S_{10}$, a temporary silicon layer, which is removed at the end of the first implant; in this way, the lattice defects introduced during the first implant within the silicon-carbide crystalline lattice are further limited.

Next (FIG. 11), the first resist mask 200 is removed, and an annealing at a temperature of approximately between 1250° C. and 1365° C., and of the duration, for example, of approximately thirty minutes, is performed in order to reduce the sites of the drift layer 10 damaged following upon the first implant, and activate the dopant species. During said annealing, the thickness of the first and second thin layers 14a', 14b' increases, and the first and second thin layers 14a', 14b' form, respectively, the first and second deep body regions 14a, 14b.

Next (FIG. 12), the top layer 12, made of silicon, is formed by means of hetero-epitaxy.

In a way in itself known, and consequently not illustrated, by means of chemical etching, the trench 20 is formed, and subsequently formed in succession, once again in a way in itself known, are the first oxide layer 24, the first gate region 26, the first and second top body regions 32a, 32b, and the source region 34.

Then formed, in a way in itself known, are the first oxide region 30 and the first dielectric region 35, and finally the first top metallization 36 and the bottom metallization 38.

As regards the enhanced trench MOSFET 60, to produce one may perform the operations described in what follows, which refer, by way of example, to the embodiment illustrated in FIG. 3.

Figure 10:
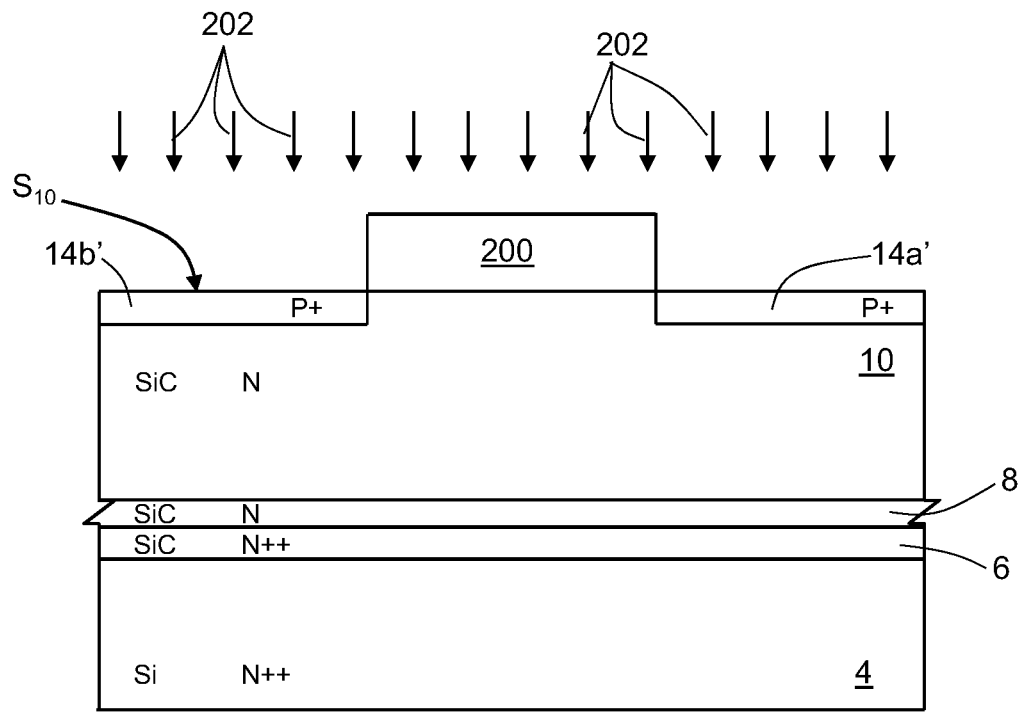

In detail, the operations illustrated in FIGS. 9-10 are performed. Next (FIG. 13), hence after performing the first implant, the first resist mask 200 is removed and, by means of epitaxial growth, the first intermediate layer 62a is formed.

Next, by means of a second resist mask 210, a second implant of dopant species of a P type (for example, aluminium or boron atoms) is performed, represented by the arrows 212, so as to localize the dopant species in a third thin layer 64' and a fourth thin layer 66', both of a P+ type. In particular, if one designates by $S_{62a}$ the top surface of the first intermediate layer 62a, the third and the fourth thin layers 64' and 66' are arranged underneath the surface $S_{62a}$ of the first intermediate layer 62a, and are to form, respectively, the first and second intermediate body regions 64, 66, once appropriate annealing processes are terminated. Also this second implant is executed with a hot process, i.e., at a temperature of approximately between 500° C. and 850° C., and with a dosage comprised in the range approximately between $1\cdot10^{13}$ cm$^{-2}$ and $1\cdot10^{15}$ cm$^{-2}$ and an energy approximately between 30 keV and 2 MeV. Furthermore, in a way in itself known, and hence not illustrated, also the second implant may be made after providing, on the surface $S_{62a}$ of the first intermediate layer 62a, a temporary silicon layer, which is removed at the end of the second implant.

Next (FIG. 14), the second resist mask 210 is removed and, by means of epitaxial growth, the second intermediate layer 62b is formed, and subsequently, by means of a third resist mask 220, a third implant of dopant species of a P type (for example, aluminium or boron atoms) is performed, represented by the arrows 222, so as to localize the dopant species in a fifth thin layer 64" and a sixth thin layer 66", both of a P+ type. In particular, the fifth and sixth thin layers 64" and 66" are arranged underneath the contact surface $S_{62}$ and are to form, respectively, the first and second intermediate body regions 64, 66, once appropriate annealing processes are terminated. Also this third implant is executed with a hot process, i.e., at a temperature of approximately between 500° C. and 850° C., and with a dosage in the range approximately between $1·10^{13}$ cm$^{-3}$ and $1·10^{15}$ cm$^{-3}$ and an energy approximately between 30 keV and 2 MeV. Furthermore, in a way in itself known, and hence not illustrated, also the third implant may be made after providing, on the contact surface $S_{62}$, a temporary silicon layer, which is removed at the end of the third implant.

Next (FIG. 15), the third resist mask 220 is removed, and an annealing at a temperature of approximately between 1250° C. and 1365° C., and of the duration, for example, of thirty minutes is performed. In this way, the first and second thin layers 14a', 14b' form, respectively, the first and second deep body regions 14a, 14b. Likewise, the third and fifth thin layers 64', 64" increase in thickness and form the first intermediate body region 64; moreover, the fourth and sixth thin layers 66', 66" increase in thickness and form the second intermediate body region 66.

Figure 13:
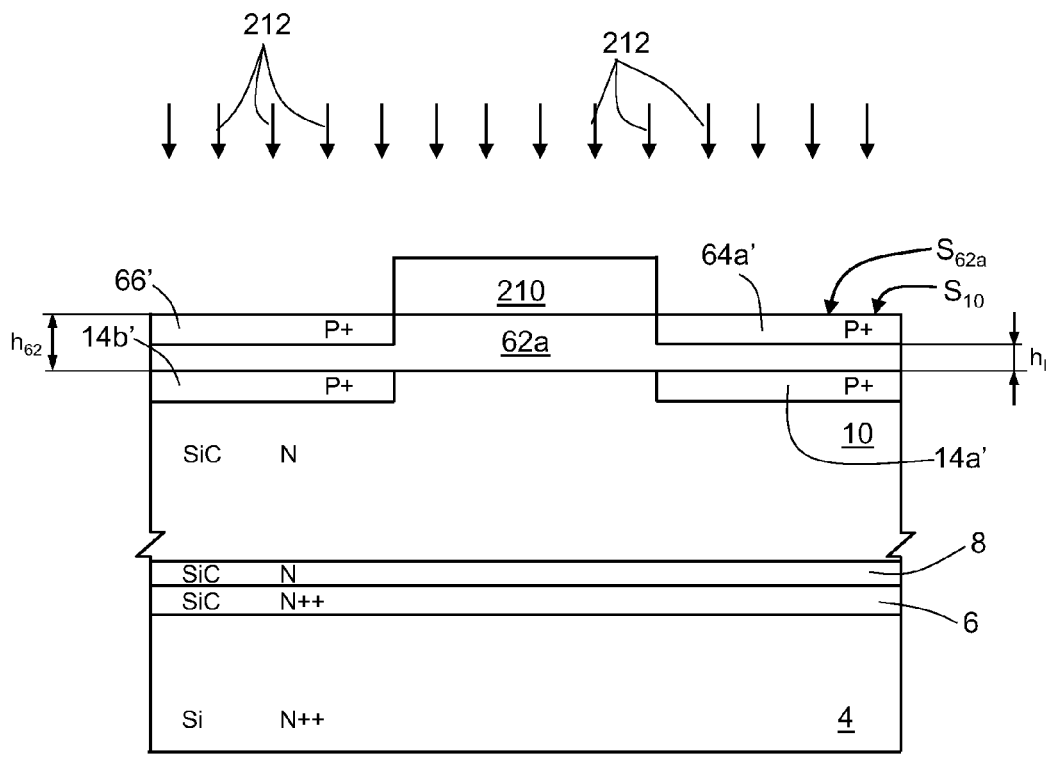
Figure 14:
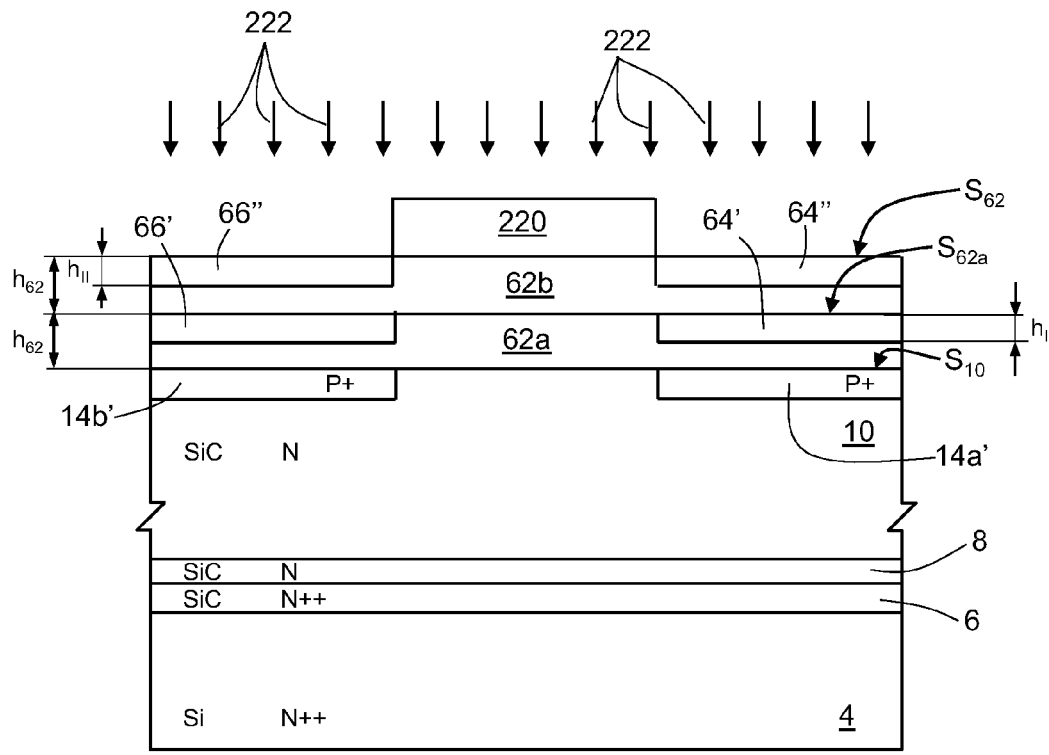
Figure 15:
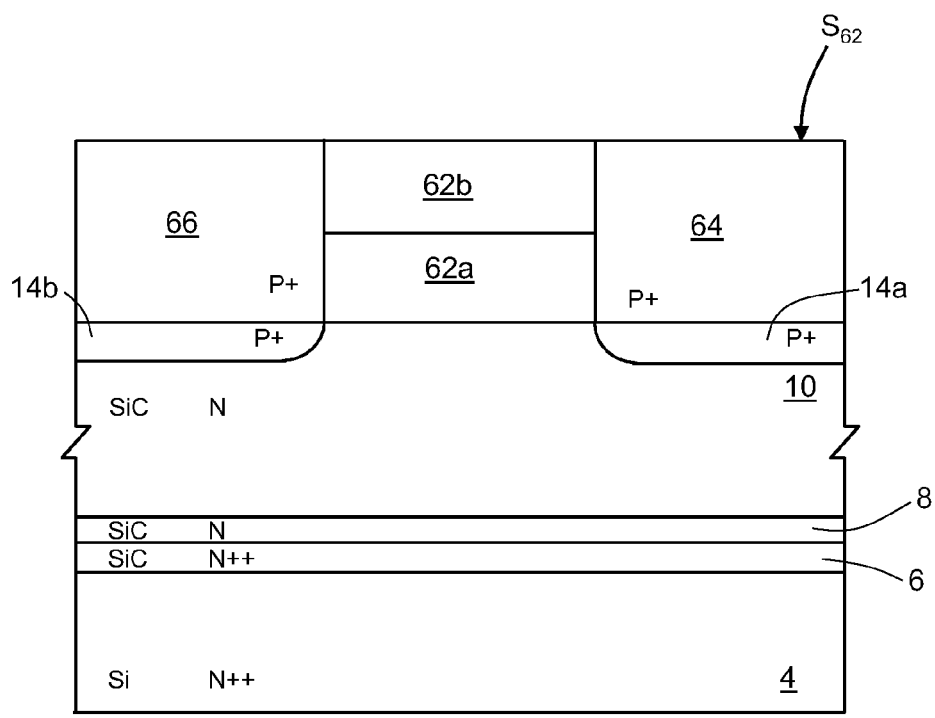
Figure 16:
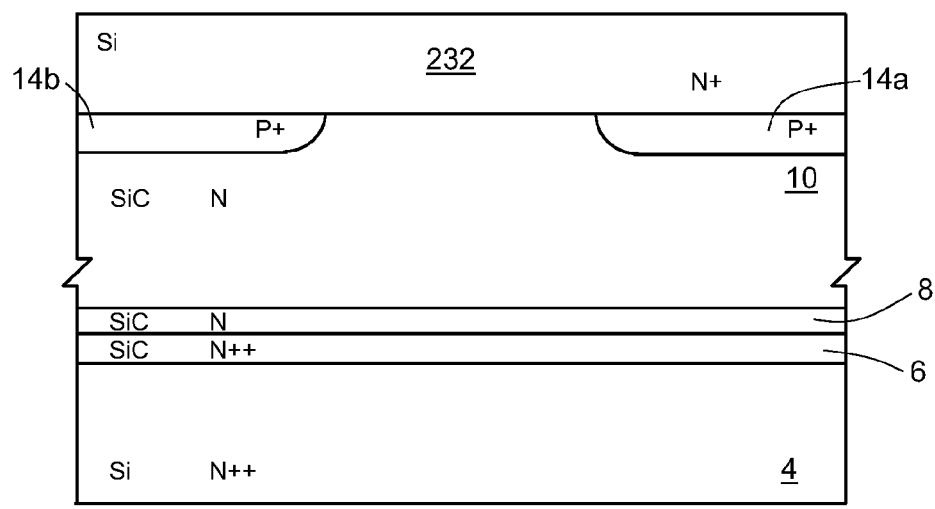
Figure 17:
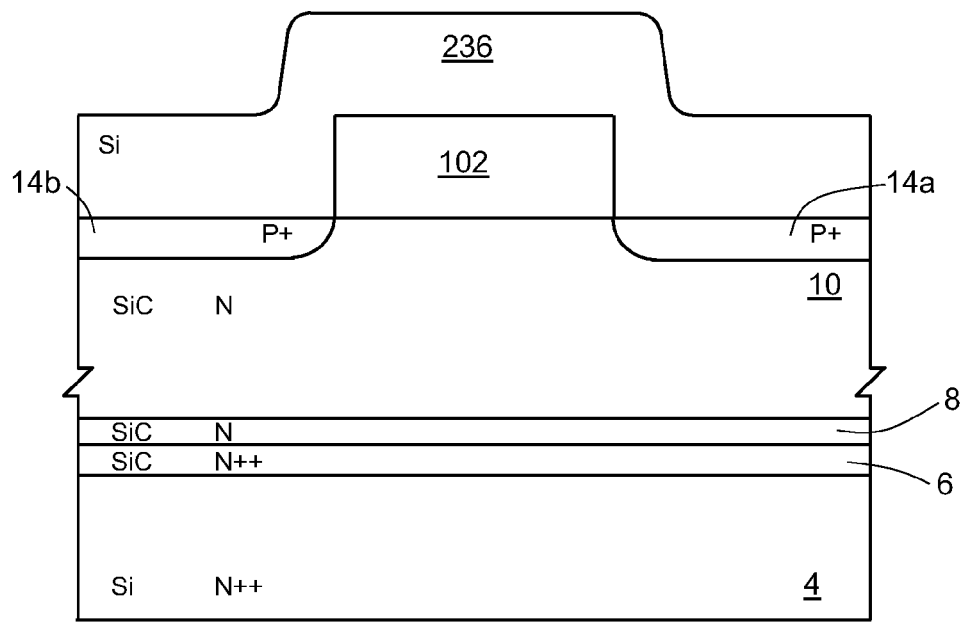
Figure 18:
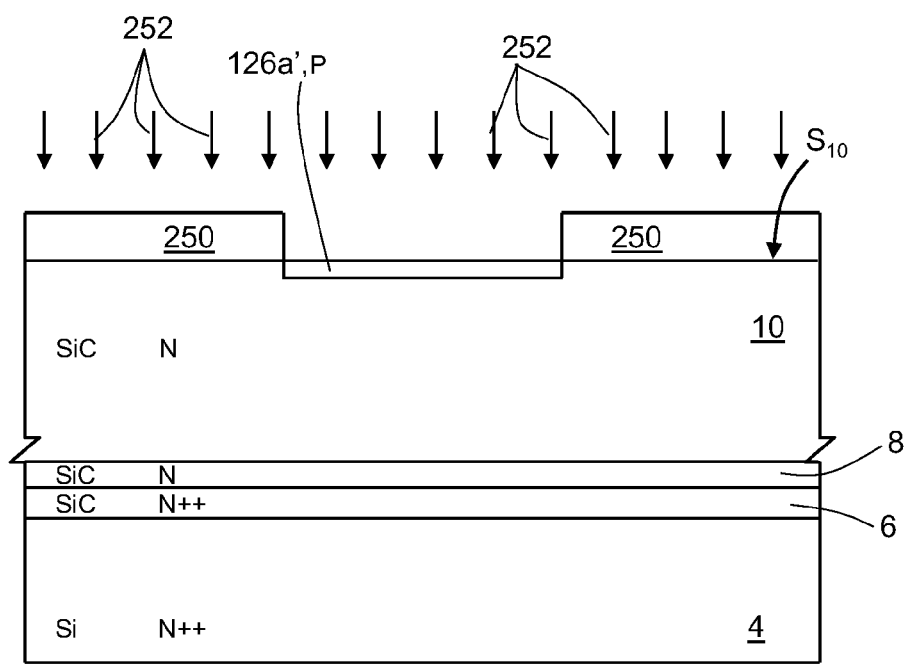
Figure 19:
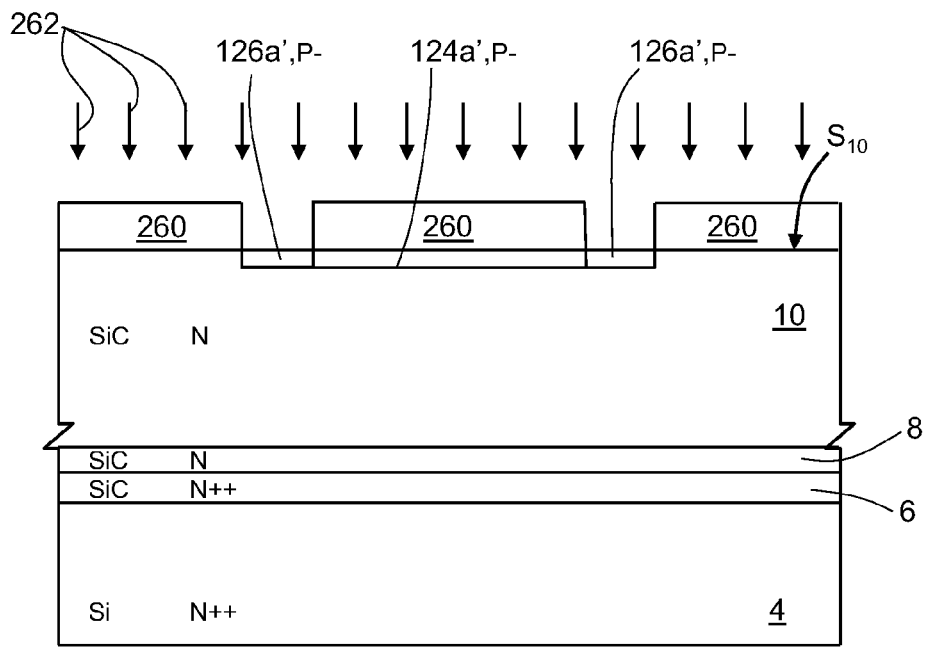
Figure 20:
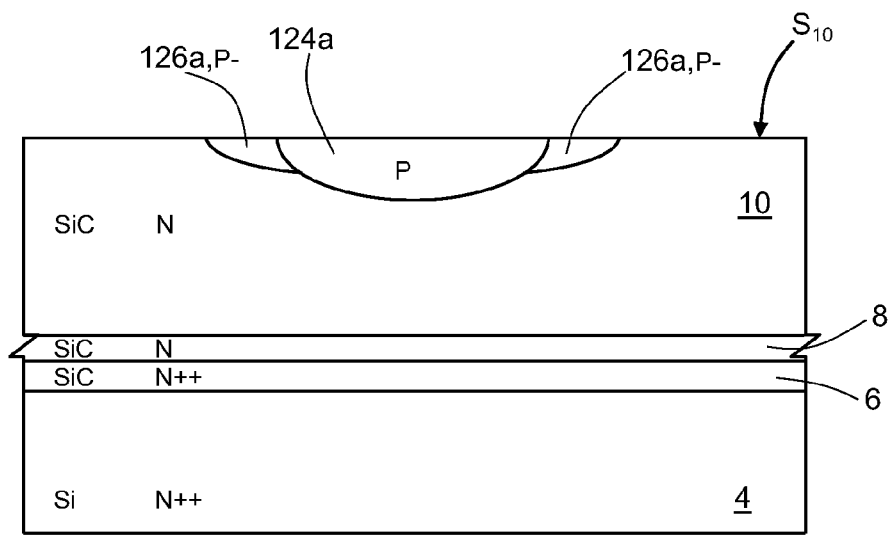
Figure 21:
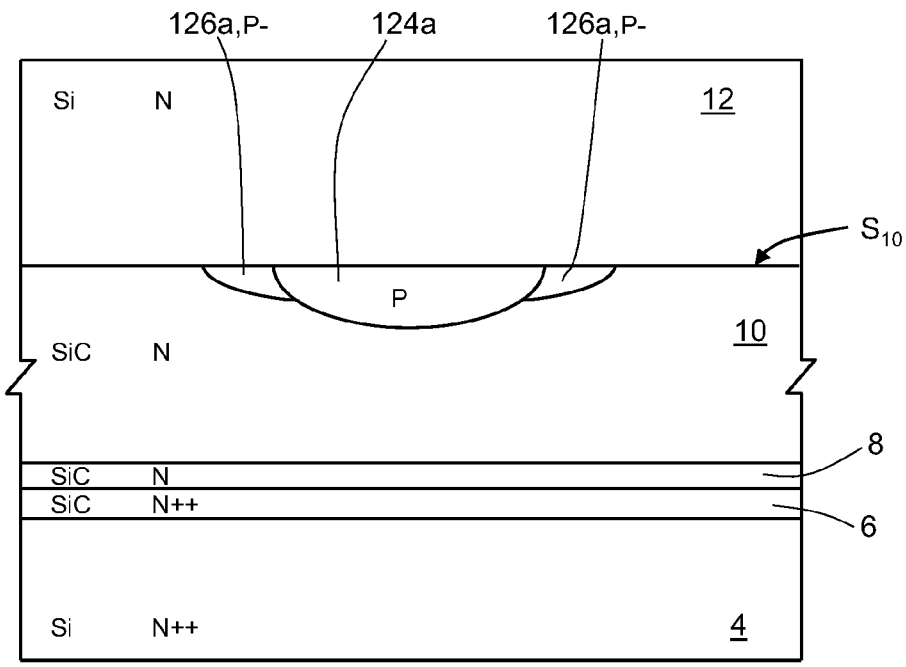
Figure 22:
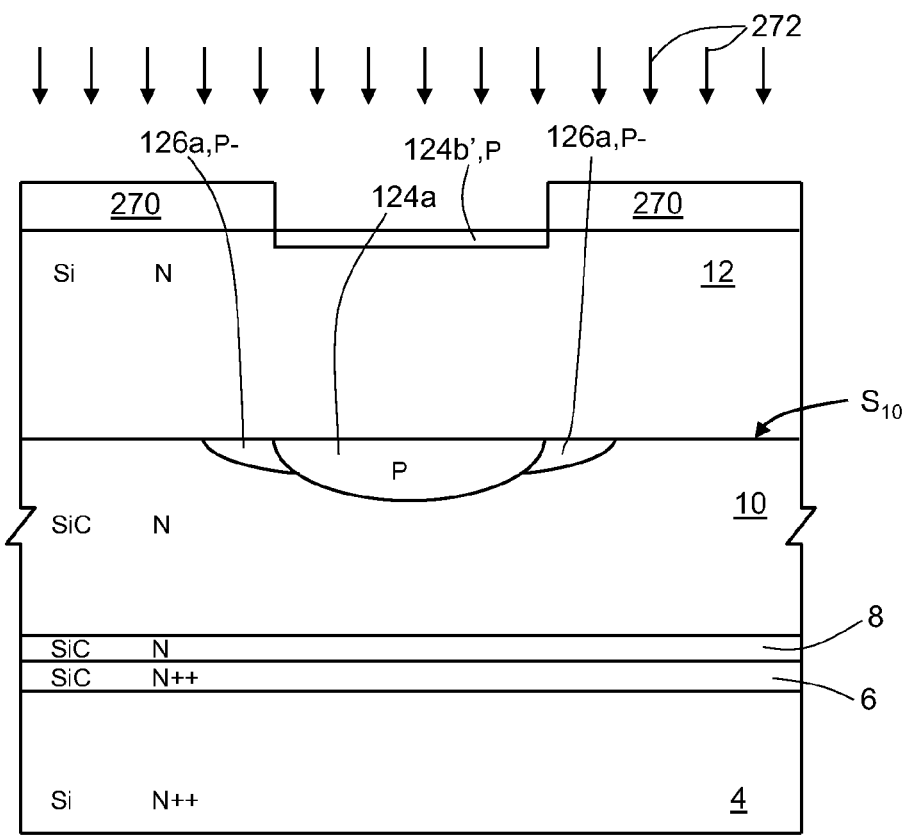
Figure 23:
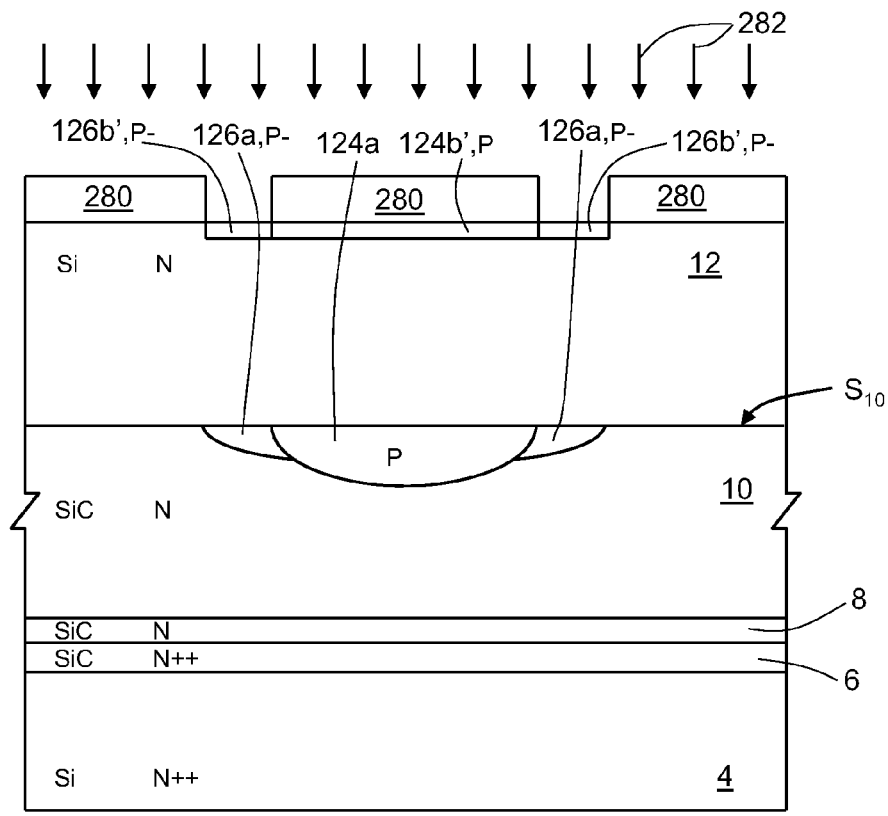
Figure 24:
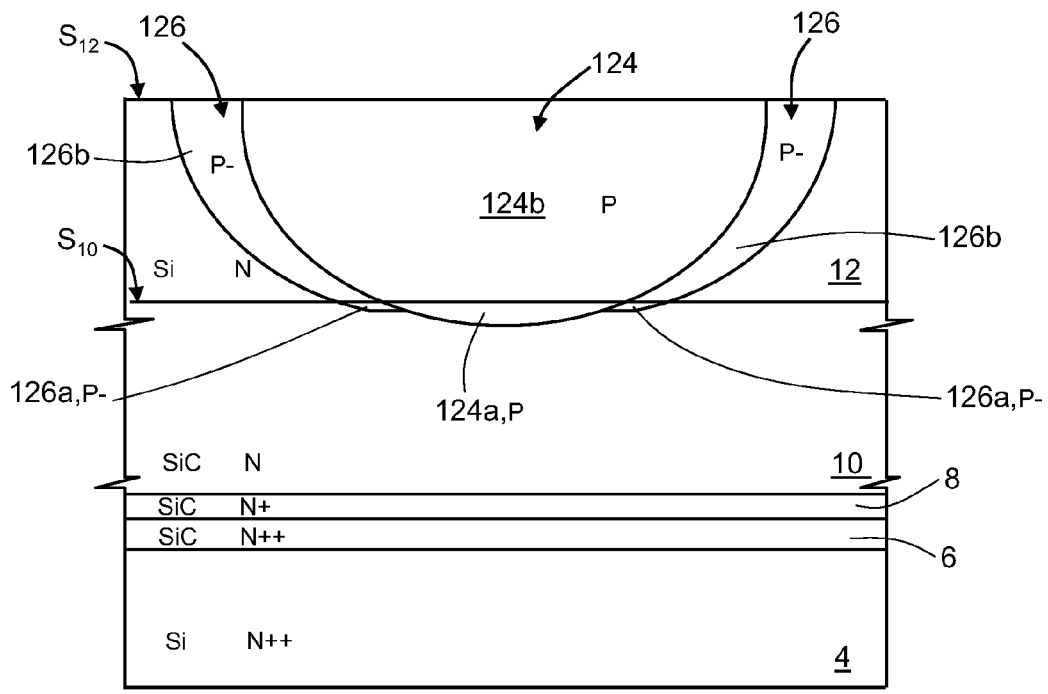

It may be noted that, even though FIGS. 13 and 14 show an embodiment in which the third and fourth thin layers 64' and 66' have a thickness $h_I$ lower than the thickness $h_{62}$ of the first intermediate layer 62a, and in which the fifth and sixth thin layer 64" and 66" have a thickness $h_{11}$ lower than the thickness $h_{62}$ of the second intermediate layer 62b, it may be likewise possible to carry out the second and third implants in such a way that $h_I \geq h_{62}$ and $h_{II} \geq h_{62}$.

Next, the top silicon layer 12 is formed, by means of hetero-epitaxy, and then, in a way in itself known, the first and second top body regions 32a, 32b, the trench 20, the first gate region 26, the first oxide layer 24, the first source region 34, the first oxide region 30, the first dielectric region 35, as well as the first top metallization 36, the bottom metallization 38, and the first gate metallization are provided.

Figure 11:
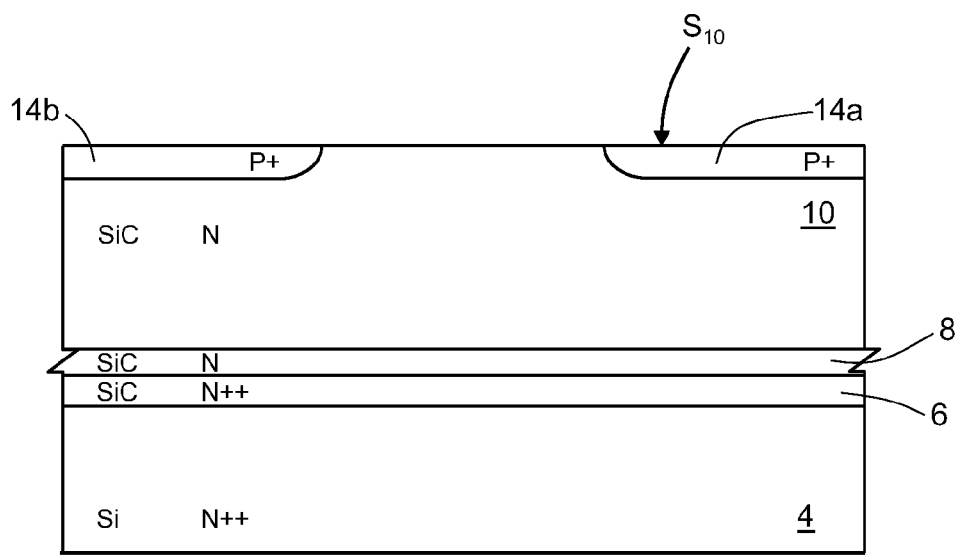
Figure 12:
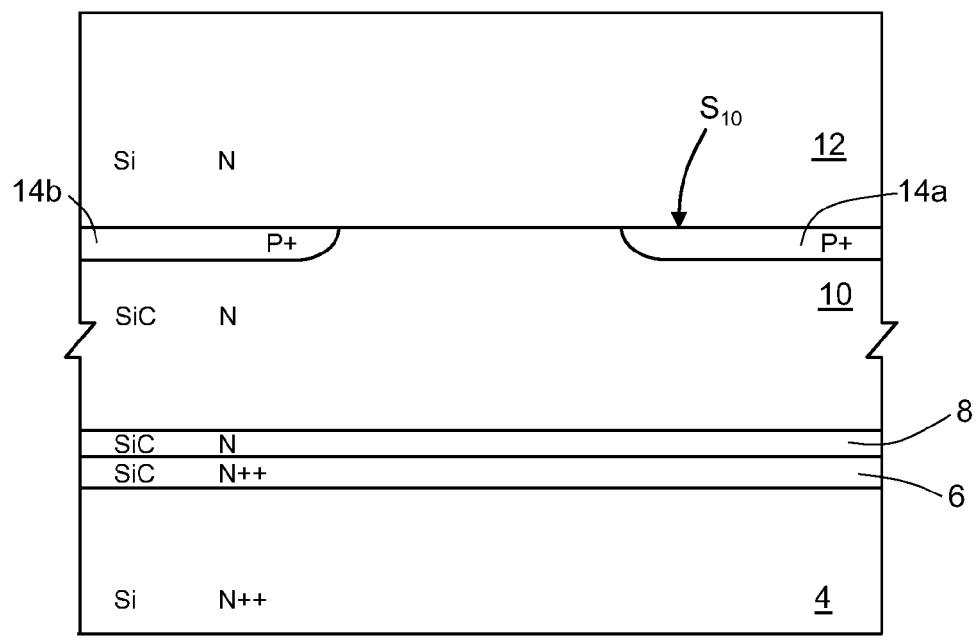

To manufacture the JFET 100 it is, instead, possible to carry out the operations illustrated in FIGS. 9-11.

Next (FIG. 16), hence, after performing the annealing, an additional layer 232, which is made of silicon and is of an N++ type (for example, doped with phosphorus), and which is to form the second source region 102, is formed, by means of hetero-epitaxy.

Next (FIG. 17), by means of a chemical etch, portions of the additional layer 232 are selectively removed so as to form the second source region 102. Next, an insulating layer 236 is deposited, which is made, for example, of borophosphosilicate glass and is to form the second dielectric region 106.

In a way not illustrated, by means of chemical etching, portions of the insulating layer 236 are selectively removed so as to form the second dielectric region 106, and the second top metallization 104 and the second gate metallization 108 are provided.

Finally, to manufacture the bipolar junction transistor 120, it is possible to proceed as described in what follows.

In detail, the operations illustrated in FIG. 9 are performed. Next (FIG. 18) by means of a fourth resist mask 250, a fourth implant of dopant species of a P type (for example, aluminium or boron atoms) is performed, represented by the arrows 252, so as to localize the dopant species in a seventh thin layer 126a' of a P type, which is localized underneath the intermediate surface $S_{10}$ and is to form the base region 124. Also this fourth implant is executed with a hot process, i.e., at a temperature of approximately between 500° C. and 850° C., and with a dosage in the range approximately between $1·10^{14}$ cm$^{-2}$ and $1·10^{15}$ cm$^{-2}$ and an energy approximately between 30 keV and 2 MeV. Once again, also the fourth implant may be made after providing, on the intermediate surface $S_{10}$, a temporary silicon layer, which is removed at the end of the fourth implant.

Next (FIG. 19) the fourth resist mask 250 is removed, and by means of a fifth resist mask 260, a fifth implant of dopant species of a P type (for example, aluminium or boron atoms) is performed, represented by the arrows 262, so as to localize the dopant species in an eighth thin layer 126a' of a P− type, which is localized underneath the intermediate surface $S_{10}$ and is to form the edge region 126. Also this fifth implant is executed with a hot process, i.e., at a temperature of approximately between 500° C. and 850° C., and with a dosage in the range approximately between $1·10^{12}$ cm$^{-2}$ and $1·10^{13}$ cm$^{-2}$ and an energy approximately between 30 keV and 2 MeV. Once again, also the fifth implant may be carried out after providing, on the intermediate surface $S_{10}$, a temporary silicon layer, which is removed at the end of the fifth implant.

Next (FIG. 20) the fifth resist mask 260 is removed, and an annealing, at a temperature of approximately between 1250° C. and 1365° C., and of the duration, for example, of approximately thirty minutes is performed. In this way, the seventh and eighth thin layers 124a', 126a' form, respectively, a first portion of base region 124a and a first portion of edge region 126a, which extend facing the intermediate surface $S_{10}$, the first portion of edge region 126a surrounding the first portion of base region 124a.

Next (FIG. 21), by means of epitaxial growth, the top layer 12 is formed, arranged above the intermediate surface $S_{10}$.

Next (FIG. 22), by means of a sixth resist mask 270, a sixth implant of dopant species of a P type (for example, aluminium or boron atoms) is performed, represented by the arrows 272, so as to localize the dopant species in a ninth thin layer 124b' of a P type, which is localized underneath the top surface $S_{12}$ and is to form the base region 124.

Next (FIG. 23), the sixth resist mask 270 is removed and, by means of a seventh resist mask 280, a seventh implant of dopant species of a P type (for example, aluminium or boron atoms) is performed, represented by the arrows 282, so as to localize the dopant species in a tenth thin layer 126b' of a P− type, localized underneath the top surface $S_{12}$, which surrounds the ninth thin layer 124b' and is to form the edge region 126.

Next (FIG. 24), the seventh resist mask 280 is removed and an annealing at a temperature of approximately between 1100° C. and 1150° C., and of the duration of approximately one hundred and twenty minutes is performed, in such a way that the ninth and tenth thin layers 124b', 126b' form, respectively, a second portion of base region 124b and a second portion of edge region 126b, extending facing the top surface $S_{12}$, the second portion of edge region 126b surrounding the second portion of base region 124b. Furthermore, the second portion of base region 124b and the second portion of edge region 126b traverse the entire thickness of the top layer 12, until they connect, respectively, to the first portion of base region 124a and to the first portion of edge region 126a so as to form the base region 124 and the edge region 126.

In a way in itself known, and consequently not illustrated, the emitter region 122, the channel-stopper region 128, the insulating region 140, the emitter metallization 130, the base metallization 132, the equipotential ring 134, and the bottom metallization 38 are then provided.

Advantages that embodiments of the present integrated electronic device and the present manufacturing method afford emerge clearly from the foregoing discussion.

In detail, an embodiment of the present electronic device is formed starting from a silicon substrate, with consequent benefits in terms of reduced costs and availability of wafers of large dimensions. In addition, the present integrated electronic device uses the properties of silicon carbide (wide bandgap) to confine the electrical field within the silicon-carbide epitaxial layers, preventing generation of the breakdown phenomenon within the silicon substrate. In particular, the use of the first and second buffer layers 6, 8 prevent occurrence of breakdown within the substrate 4. In addition, the doping profiles and the thicknesses $h_6$, $h_8$ of the first and second buffer layers 6, 8 may be modulated so that the electrical field that is generated therein has a desired profile.

Furthermore, according to an embodiment of the present manufacturing method, the first and second deep body regions 14a, 14b, as well as, in the case of the bipolar junction transistor 120, the first portion of base region 124a, are obtained by ion implantation, with consequent greater control of the corresponding thicknesses, which may be larger than what may be obtained by diffusion.

Finally, it is evident that modifications and variations may be made to the present integrated electronic device and manufacturing method, without thereby departing from the scope of the present disclosure.

For example, it may be possible for there to be present just one of the first buffer layer 6 and the second buffer layer 8. In addition, it may be possible to reverse all the conductivity types of the semiconductor elements described, and/or use different semiconductor materials.

Furthermore, an embodiment of the present electronic device may be disposed on a first integrated circuit, which may be coupled to one or more second integrated circuits to form a system. One or more of the first and second integrated circuits may include a controller such as a processor.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A semiconductor device, comprising:
a first semiconductor layer having a first bandgap;
a second semiconductor layer disposed over the first layer and having a second bandgap that is wider than the first bandgap;
a third semiconductor layer disposed over the second layer and having the first bandgap;
the third semiconductor layer having a trench therein and defining first and second opposing walls;
a P+ type first semiconductor region spaced from the first wall and extending from a bottom surface of the third semiconductor layer into the second semiconductor layer a first depth;
a P+ type second semiconductor region spaced from the second wall and extending from the bottom surface of the third semiconductor layer into the second semiconductor layer the first depth;
wherein the second semiconductor layer further comprises in stacked relation a first buffer semiconductor layer having a first thickness, a second buffer semiconductor layer having the first thickness, and a drift semiconductor layer having a second thickness.

2. The semiconductor device of claim 1 wherein:
the first layer includes a first substrate layer;
the second layer includes a second epitaxial layer; and
the third layer includes a third epitaxial layer.

3. The semiconductor device of claim 1 wherein:
the first semiconductor layer includes silicon;
the second semiconductor layer includes silicon carbide; and
the third semiconductor layer includes silicon.

4. The semiconductor device of claim 1 wherein:
the first semiconductor layer includes a region of a first conductivity;
the second semiconductor layer includes a region of the first conductivity; and
the third semiconductor layer includes a region of the first conductivity.

5. The semiconductor device of claim 1 wherein:
the first semiconductor layer includes a region of a first conductivity;
the second semiconductor layer includes a region of a second conductivity; and
the third semiconductor layer includes a region of the second conductivity.

6. The semiconductor device of claim 1 wherein:
the first semiconductor layer includes a region having a first doping level;
the second semiconductor layer includes a region having a second doping level that is less than the first doping level; and
the third semiconductor layer includes a region having a third doping level that is less than the first doping level.

7. The semiconductor device of claim 1 wherein:
the first semiconductor layer includes a region having a first doping level;
the second semiconductor layer includes a region having a second doping level that is less than the first doping level; and
the third semiconductor layer includes a region having a third doping level that is greater than the second doping level.

8. The semiconductor device of claim 1, wherein
the first buffer semiconductor layer is disposed between the first and second layers, having approximately the second bandgap, and having a first doping level; and
the second buffer semiconductor layer disposed between the first and second layers, having approximately the second bandgap, and having a second doping level that is greater than the first doping level.

9. The semiconductor device of claim 1, further comprising:
a trench disposed in the second and third layers and having a wall;
a gate insulator disposed on the trench wall;
a gate disposed in the trench over the gate insulator;
a body region of a first conductivity disposed in the third layer adjacent to the trench;
a source region of a second conductivity disposed in the body region adjacent to the trench;
a deep body region of the first conductivity disposed in the second layer adjacent to the body region; and
wherein the first layer has the second conductivity.

10. The semiconductor device of claim 1, further comprising:
- a trench disposed in the second and third layers and having a wall;
- a gate insulator disposed on the trench wall;
- a gate disposed in the trench over the gate insulator;
- a body region of a first conductivity disposed in the third layer adjacent to the trench;
- a source region of a second conductivity disposed in the body region adjacent to the trench;
- a deep body region of the first conductivity disposed in the second layer adjacent to the body region; and
- wherein the first layer has the first conductivity.

11. The semiconductor device of claim 1, further comprising:
- a gate insulator disposed over the third layer;
- a gate disposed over the gate insulator;
- a body region of a first conductivity disposed in the third layer adjacent to the gate insulator;
- a source region of a second conductivity disposed in the body region adjacent to the gate insulator;
- a deep body region of the first conductivity disposed in the second layer adjacent to the body region; and
- wherein the first layer has the second conductivity.

12. The semiconductor device of claim 1, further comprising:
- a gate insulator disposed over the third layer;
- a gate disposed over the gate insulator;
- a body region of a first conductivity disposed in the third layer adjacent to the gate insulator;
- a source region of a second conductivity disposed in the body region adjacent to the gate insulator;
- a deep body region of the first conductivity disposed in the second layer adjacent to the body region; and
- wherein the first layer has the first conductivity.

13. The semiconductor device of claim 1, further comprising:
- a gate disposed over the second layer and adjacent to the third layer;
- a body region of a first conductivity disposed in the second layer adjacent to the gate; and
- a source region of a second conductivity disposed in the third layer adjacent to the body region.

14. An integrated circuit, comprising:
a semiconductor device, including:
a first semiconductor layer having a first bandgap;
a second semiconductor layer disposed over the first layer and having a second bandgap that is wider than the first bandgap; and
a third semiconductor layer disposed over the second layer and having the first bandgap;
the third semiconductor layer having a trench therein and defining a first and second opposing walls;
a P+ type first semiconductor region spaced from the first wall and extending from a bottom surface of the third semiconductor layer into the second semiconductor layer a first depth;
a P+ type second semiconductor region spaced from the second wall and extending from the bottom surface of the third semiconductor layer into the second semiconductor layer the first depth;
wherein the second semiconductor layer further comprises in stacked relation a first buffer semiconductor layer having a first thickness, a second buffer semiconductor layer having the first thickness, and a drift semiconductor layer having a second thickness.

15. The integrated circuit of claim 14 wherein the semiconductor device includes a MOS transistor.

16. The integrated circuit of claim 14 wherein the semiconductor device includes a junction field-effect transistor.

17. The integrated circuit of claim 14 wherein the semiconductor device includes an insulated-gate bipolar transistor.

18. A system, comprising:
a first integrated circuit, including:
a semiconductor device, including:
a first semiconductor layer having a first bandgap;
a second semiconductor layer disposed over the first layer and having a second bandgap that is greater than the first bandgap; and
a third semiconductor layer disposed over the second layer and having approximately the first bandgap; and
a second integrated circuit coupled to the first integrated circuit;
the third semiconductor layer having a trench therein and defining first and second opposing walls;
a P+ type first semiconductor region spaced from the first wall and extending from a bottom surface of the third semiconductor layer into the second semiconductor layer a first depth;
a P+ type second semiconductor region spaced from the second wall and extending from the bottom surface of the third semiconductor layer into the second semiconductor layer the first depth;
wherein the second semiconductor layer further comprises in stacked relation a first buffer semiconductor layer having a first thickness, a second buffer semiconductor layer having the first thickness, and a drift semiconductor layer having a second thickness.

19. The system of claim 18 wherein the first and second integrated circuits are disposed on a same die.

20. The system of claim 18 wherein the first and second integrated circuits are disposed on respective dies.

21. The system of claim 18 wherein one of the first and second integrated circuits includes a controller.

22. A method, comprising:
generating a voltage across a semiconductor device having a first semiconductor layer having a first bandgap, a second semiconductor layer disposed over the first layer and having a second bandgap that is greater than the first bandgap, and a third semiconductor layer disposed over the second layer and having approximately the first bandgap, the third semiconductor layer having a trench therein and defining first and second opposing walls, a P+ type first semiconductor region spaced from the first wall and extending from a bottom surface of the third semiconductor layer into the second semiconductor layer a first depth, a P+ type second semiconductor region spaced from the second wall and extending from the bottom surface of the third semiconductor layer into the second semiconductor layer the first depth;
wherein the second semiconductor layer comprises at least three layers each having a different doping concentration;
causing a first portion of the voltage to be across the first and third semiconductor layers; and
causing a second portion of the voltage to be across the second semiconductor layer, the second portion greater than the first portion.

23. The method of claim 22 wherein the first portion of the voltage is approximately zero volts.

24. The method of claim 22 wherein:
generating the voltage includes generating the voltage across at least one buffer semiconductor layer disposed between the first and second layers and having a third bandgap that is greater than the first bandgap; and
causing a third portion of the voltage to be across the at least one buffer layer, the third portion greater than the first portion.

25. An integrated electronic device formed in a body of semiconductor material, comprising:
a substrate of a first semiconductor material, the first semiconductor material having a first bandgap;
a first epitaxial region made of a second semiconductor material and with a first type of conductivity, which overlies the substrate and defines a first surface, the second semiconductor material having a second bandgap wider than the first bandgap; and
a second epitaxial region of the first semiconductor material, which overlies and is in direct contact with the first epitaxial region;
the second epitaxial region having a trench therein and defining first wall and second opposing walls;
a P+ type first semiconductor region spaced from the first wall and extending from a bottom surface of the second epitaxial region into the first epitaxial region a first depth;
a P+ type second semiconductor region spaced from the second wall and extending from the bottom surface of the second epitaxial region into the first epitaxial region the first depth;
wherein the first epitaxial region comprises a first buffer layer, which overlies the substrate, a second buffer layer, which overlies the first buffer layer, and a drift layer, which overlies the first buffer layer and defines the first surface, the first buffer layer, the second buffer layer, and the drift layer each having different doping levels.

26. The electronic device according to claim 25, wherein the second buffer layer, arranged between the first buffer layer and the drift layer, comprises a doping level lower than the doping level of the first buffer layer.

27. The electronic device according to claim 25, further comprising a semiconductor region of the second type of conductivity, extending at least in part through the drift layer.

28. The electronic device according to claim 25, wherein the drift layer defines the first surface, and the semiconductor region comprises a first portion and a second portion, which face the first surface and are arranged at a distance apart laterally so as to delimit an internal region.

29. The electronic device according to claim 28, wherein the substrate is of the first type of conductivity, and the electronic device is a device chosen between a trench MOSFET and a planar-cell MOSFET.

30. The electronic device according to claim 28, which forms a trench MOSFET, wherein the second epitaxial region defines a main surface of the body, a trench extending within the second epitaxial region starting from the main surface and traversing the internal region at least partially.

31. The electronic device according to claim 29, wherein the body further comprises an intermediate region arranged between the first epitaxial region and the second epitaxial region; the electronic device further comprising a first additional body region and a second additional body region, which are of the second type of conductivity, are arranged laterally at a distance apart, and extending through the intermediate region between the second epitaxial region and, respectively, the first and second portions.

32. The electronic device according to claim 28, which forms a JFET, wherein the first and second portions are arranged at a first distance and form respective interfaces with the drift layer, the doping levels of the drift layer and of the first and second portions being such that, in the absence of biasing, at the interfaces depleted regions are formed, which extend within the drift layer for a depth at least equal to half of the first distance.

33. The electronic device according to claim 28, which forms a device chosen between a trench IGBT and a planar-cell IGBT, wherein the substrate and the second epitaxial region are, respectively, of the second type of conductivity and of the first type of conductivity, the second epitaxial region defining a main surface of the body, the electronic device further comprising a first top body region and a second top body region, which are of the second type of conductivity, and extend within the second epitaxial region starting from the main surface, as far as, respectively, the first and second portions.

34. The electronic device according to claim 28, which forms a bipolar junction transistor, wherein the substrate and the second epitaxial region are of the first type of conductivity, the second epitaxial region defining a main surface of the body; the electronic device further comprising a current-conduction region of the first type of conductivity, and a control region of the second type of conductivity, the current-conduction region extending within the second epitaxial region starting from the main surface, the control region extending, starting from the main surface, throughout the thickness of the second epitaxial region, and extending partially in the drift layer.

35. The electronic device according to claim 34, wherein the control region surrounds laterally and at the bottom the current-conduction region, the device further comprising an edge region, which surrounds the control region and has the second type of conductivity and doping level lower than the control region.

36. A semiconductor device, comprising:
a first semiconductor layer having a first conductivity with a first doping concentration and having a first bandgap;
a second semiconductor layer disposed over the first semiconductor layer and having a second bandgap that is wider than the first bandgap and having the first conductivity with a second doping concentration that is less than the first doping concentration, the second semiconductor layer having a first thickness;
a third semiconductor layer disposed over the second semiconductor layer and having approximately the second bandgap and having the first conductivity with a third doping concentration that is less than the second doping concentration; the third semiconductor layer having the first thickness;
a fourth semiconductor layer disposed over the third semiconductor layer and having approximately the second bandgap and having the first conductivity with a fourth doping concentration that is less than the third doping concentration; the fourth semiconductor layer having a second thickness that is larger than the first thickness;
a fifth semiconductor layer disposed over the fourth semiconductor layer and having approximately the first bandgap and having a second conductivity;
the fifth semiconductor layer defining a trench therein and defining first and second opposing walls;

a P+ type first semiconductor region spaced from the first wall and extending from a bottom surface of the fifth semiconductor layer into the fourth semiconductor layer a first depth; and a P+ type second semiconductor region spaced from the second wall and extending from the bottom surface of the fifth semiconductor layer into the fourth semiconductor layer the first depth.

37. The semiconductor device of claim 36, wherein the first thickness is approximately 0.5 micrometers.

38. The semiconductor device of claim 36, wherein the second thickness is approximately one to ten micrometers.

39. The semiconductor device of claim 36, wherein the first conductivity comprises an N− type conductivity and the second conductivity comprises a P− type conductivity.

* * * * *

UNITED STATES PATENT AND TRADEMARK OFFICE
CERTIFICATE OF CORRECTION

| | |
|---|---|
| PATENT NO. | : 9,142,666 B2 |
| APPLICATION NO. | : 13/221733 |
| DATED | : September 22, 2015 |
| INVENTOR(S) | : Donato Corona et al. |

It is certified that error appears in the above-identified patent and that said Letters Patent is hereby corrected as shown below:

Title page, item (75)    Delete: "Syracuse (IT)"
Insert --Siracusa (IT)--

Signed and Sealed this
Twenty-second Day of March, 2016

Michelle K. Lee
*Director of the United States Patent and Trademark Office*